(12) United States Patent
Imamura et al.

(10) Patent No.: US 12,212,370 B2
(45) Date of Patent: Jan. 28, 2025

(54) LIGHT RECEIVING DEVICE AND COMMUNICATION DEVICE

(71) Applicant: NEC Corporation, Tokyo (JP)

(72) Inventors: Toshiki Imamura, Tokyo (JP); Koya Takata, Tokyo (JP); Fujio Okumura, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 109 days.

(21) Appl. No.: 18/012,311

(22) PCT Filed: Apr. 23, 2021

(86) PCT No.: PCT/JP2021/016471
§ 371 (c)(1),
(2) Date: Dec. 22, 2022

(87) PCT Pub. No.: WO2022/004106
PCT Pub. Date: Jan. 6, 2022

(65) Prior Publication Data
US 2023/0261760 A1   Aug. 17, 2023

(30) Foreign Application Priority Data
Jul. 1, 2020   (JP) .................................. 2020-113680

(51) Int. Cl.
*H04B 10/11* (2013.01)
*H01L 31/0232* (2014.01)
*H04B 10/50* (2013.01)
*H04B 10/69* (2013.01)

(52) U.S. Cl.
CPC ..... *H04B 10/695* (2013.01); *H01L 31/02327* (2013.01); *H04B 10/505* (2013.01); *H04B 10/6972* (2013.01)

(58) Field of Classification Search
CPC ............................ H04B 10/112; H04B 10/114
See application file for complete search history.

(56) References Cited

U.S. PATENT DOCUMENTS

| | | | |
|---|---|---|---|
| 6,915,080 B2* | 7/2005 | Heminger | H04B 10/1141 398/121 |
| 9,438,338 B1* | 9/2016 | Chan | H04B 10/11 |
| 2021/0159980 A1* | 5/2021 | Ben-Yehuda | H04N 7/181 |

FOREIGN PATENT DOCUMENTS

| | | | |
|---|---|---|---|
| JP | 2002-333407 A | | 11/2002 |
| JP | 2003258736 A | * | 9/2003 |
| JP | 2016-201790 A | | 12/2016 |
| JP | 2019-186595 A | | 10/2019 |
| WO | 2008/023583 A1 | | 2/2008 |
| WO | 2014/119103 A1 | | 8/2014 |

OTHER PUBLICATIONS

International Search Report for PCT Application No. PCT/JP2021/016471, mailed on Jul. 13, 2021.

* cited by examiner

*Primary Examiner* — Shi K Li
(74) *Attorney, Agent, or Firm* — Sughrue Mion, PLLC

(57) ABSTRACT

A light receiving device that includes a lens that collects a spatial light signal, a sensor array including a plurality of light receivers that receives the spatial light signal collected by the lens, and a reception unit that integrates an electric signal derived from the spatial light signal received by each of the plurality of light receivers and selects a light receiver that receives the spatial light signal. according to a voltage value of the integrated electric signal.

6 Claims, 19 Drawing Sheets

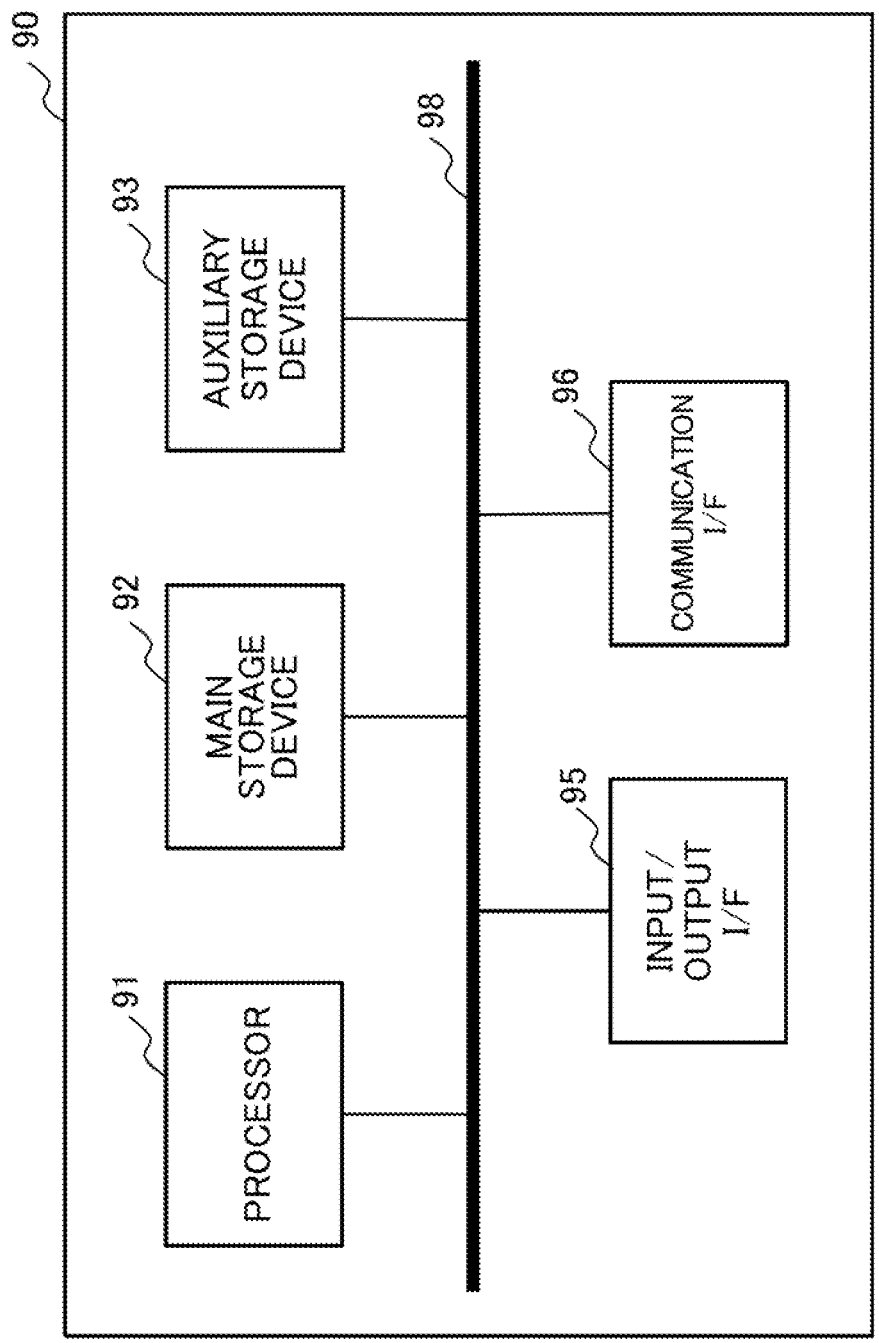

LIGHT RECEIVING DEVICE AND COMMUNICATION DEVICE

This application is a National Stage Entry of PCT/JP2021/016471 filed on Apr. 23, 2021, which claims priority from Japanese Patent Application 2020-113680 filed on Jul. 1, 2020, the contents of all of which are incorporated herein by reference, in their entirety.

TECHNICAL FIELD

The present invention relates to a light receiving device and the like used for optical spatial communication.

BACKGROUND ART

Examples of the requirements of the optical spatial communication using the spatial light signal include high light collection efficiency in receiving the spatial light signal and being able to receive the spatial light signal coming from a plurality of directions.

PTL 1 discloses a light receiving device of an optical communication device that performs communication between distant points by a light signal. The light receiving device collimates the incident light focused by a condenser lens into a collimated beam by a collimating lens with a focal length shorter than that of the condenser lens. The light receiving device of PTL 1 includes a band pass filter that transmits only a wavelength of light perpendicularly incident on a filter surface. The light receiving device of PTL 1 filters the collimated beam from the collimator lens by the band pass filter. The light receiving device of PTL 1 detects the collimated beam filtered by the band pass filter using the light receiving element.

PTL 2 discloses an optical sensor or the like used as a proximity sensor or a gesture sensor. The optical sensor of PTL 2 includes a light emitting element and a plurality of first light receiving elements. The plurality of first light receiving elements are arranged in an annular pattern at an end portion of a region where the reflected light reflected by the detection object among the emitted light from the light emitting element is incident. The plurality of first light receiving elements generate a photocurrent in response to receiving the reflected light. The device of PTL 2 detects the moving direction of the detection object based on the photocurrent generated by the first light receiving element.

PTL 3 discloses a defect inspection device that detects defects such as directional characteristics and overall unevenness in a planar display device. The device of PTL 3 includes a detector unit including a condensing lens and a detector unit. The condensing lens is disposed in such a way that a display face, which is an inspection target face of the planar display device held in a horizontal state, matches the front focal position. The two-dimensional sensor array is disposed behind the condensing lens, and includes a plurality of sensor elements in a two-dimensional direction. The device of PTL 3 moves the detector unit in parallel relative to the planar display device, collects the light from the display face with the condensing lens, and directs the collected light on the two-dimensional sensor array. The device of PTL 3 detects a defect on the display face by processing a signal output from the two-dimensional sensor array.

CITATION LIST

Patent Literature

[PTL 1] JP 2019-186595 A
[PTL 2] WO 2014/119103 A
[PTL 3] JP 2002-333407 A

SUMMARY OF INVENTION

Technical Problem

The light receiving device of PTL 1 filters only a wavelength of incident light perpendicularly incident on a filter surface. Therefore, the light receiving device of PTL 1 has a problem that the light receiving angle is small and the light receiving efficiency is small. The light receiving device of PTL 1 has a problem that an incoming direction of a light signal cannot be determined.

The optical sensor of PTL 2 detects the moving direction of the detection object by determining which one of the plurality of first light receiving elements receives the reflected light reflected by the detection object. When the detection object is located far away, the optical sensor of PTL 2 cannot detect the moving direction of the detection object due to the influence of disturbance light, and thus cannot be applied to optical spatial communication using spatial light coming from far away.

The device of PTL 3 can detect defects such as directional characteristics on the display face of the planar display device when the display face of the planar display device is disposed in such a way as to match the front focal position of the condensing lens. The device of PTL 3 cannot detect directional characteristics or the like on the display face of the planar display device unless the display face of the planar display device is disposed in such a way as to match the front focal position of the condensing lens. Therefore, the device of PTL 3 cannot be applied to optical spatial communication using spatial light.

An object of the present invention is to provide a light receiving device or the like that efficiently receives spatial light signals coming from various directions and enables simultaneous communication with a plurality of communication targets.

Solution to Problem

A light receiving device according to an aspect of the present invention includes a lens that collects a spatial light signal, a sensor array including a plurality of light receivers that receives the spatial light signal collected by the lens, and a reception unit that integrates an electric signal derived from the spatial light signal received by each of the plurality of light receivers, and selects a light receiver that receives the spatial light signal according to a voltage value of the integrated electric signal.

A communication device according to an aspect of the present invention includes a light receiving unit including a lens that collects a first spatial light signal transmitted from at least one communication target, a sensor array including a plurality of light receivers that receives the first spatial light signal collected by the lens, and a reception unit that integrates an electric signal derived from the first spatial light signal received by each of the plurality of light receivers and selects a light receiver that receives the first spatial light signal, according to a voltage value of the integrated electric signal, a light transmitting unit that transmits a second spatial light signal according to the first spatial light signal received by the light receiving unit, and a light transmitting control unit that controls the light transmitting unit according to the first spatial light signal received by the light receiving unit and causes the light transmitting unit to transmit the second spatial light signal to the communication target that is a light transmission source of the first spatial light signal.

Advantageous Effects of Invention

According to the present invention, it is possible to provide a light receiving device or the like that efficiently receives spatial light signals coming from various directions and enables simultaneous communication with a plurality of communication targets.

BRIEF DESCRIPTION OF DRAWINGS

FIG. 19 is a block diagram illustrating an example of a hardware configuration that implements a control system according to each example embodiment.

EXAMPLE EMBODIMENTS

Figure 1:
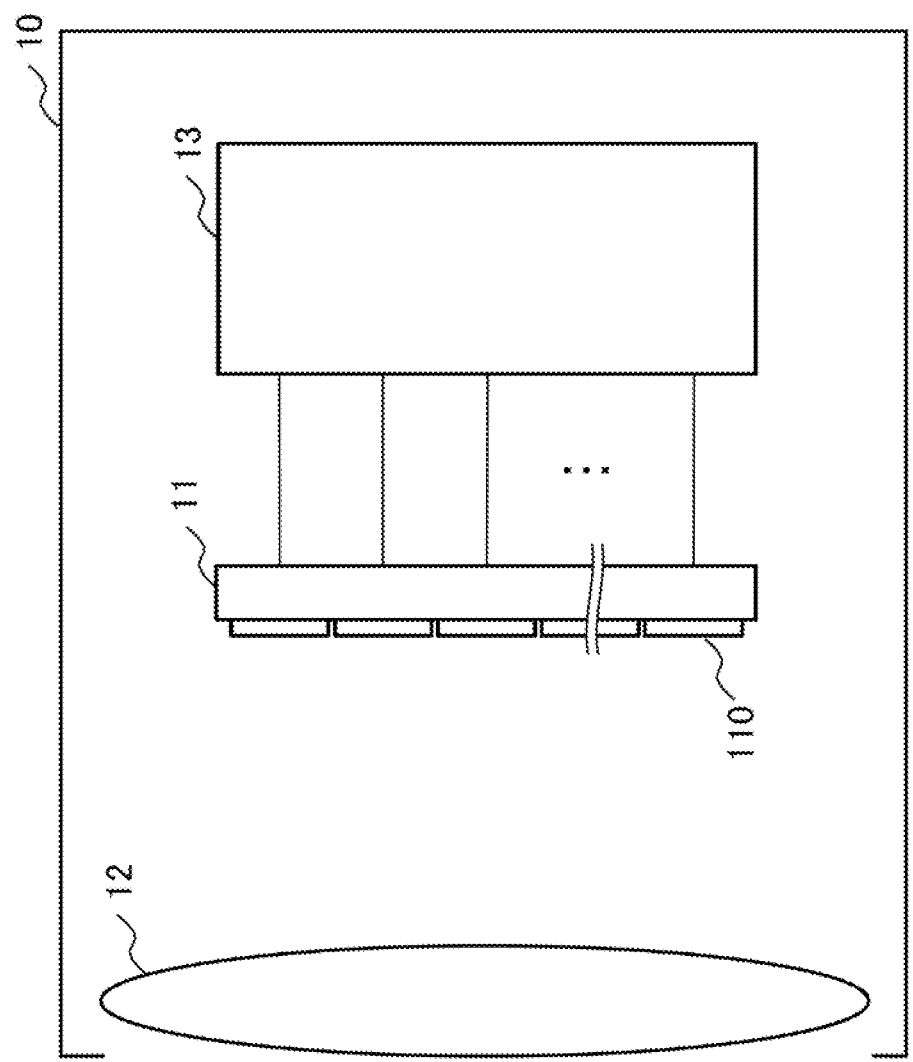
FIG. 1 is a conceptual diagram illustrating an example of a configuration of a light receiving device according to the first example embodiment.

Hereinafter, example embodiments of the present invention will be described with reference to the drawings. However, the example embodiments described below have technically preferable limitations for carrying out the present invention, but the scope of the invention is not limited to the following. In all the drawings used in the following description of the example embodiment, the same reference numerals are given to the same parts unless there is a particular reason. In the following example embodiments, repeated description of similar configurations and operations may be omitted. The directions of the arrows in the drawings illustrate an example, and do not limit the directions of signals between blocks.

First Example Embodiment

First, a light receiving device according to the first example embodiment will be described with reference to the drawings. The light receiving device of the present example embodiment is used for optical spatial communication using a spatial light signal. The light receiving device according to the present example embodiment receives a spatial light signal transmitted from a communication target. The light receiving device of the present example embodiment identifies the communication device that is the light transmission source of the spatial light signal based on the received spatial light signal. For example, when the communication device on which the light receiving device of the present example embodiment is mounted identifies a communication device that is the light transmission source of the spatial light signal, the communication device transmits the spatial light signal to the identified communication device. Hereinafter, light for searching for a communication target and light carrying information to be exchanged with the communication target are referred to as spatial light signals. Hereinafter, it is assumed that the spatial light signal includes identification information for uniquely identifying the communication device that is the light transmission source.

(Configuration)

FIG. 1 is a conceptual diagram illustrating an example of a configuration of a light receiving device 10 of the present example embodiment. The light receiving device 10 includes a sensor array 11, a lens 12, and a reception unit 13. The sensor array 11 includes a plurality of light receivers 110.

The sensor array 11 has a structure in which a plurality of light receivers 110 is disposed in an array. The plurality of light receivers 110 included in the sensor array 11 is disposed with the light receiving face facing the lens 12. The light receiving faces of the plurality of light receivers 110 form a light receiving face of the sensor array 11. The sensor array 11 is disposed in such a way that the light receiving face is located between the main surface of the lens 12 and the focal surface of the lens 12. The focal surface of the lens 12 is formed farther away from the lens 12 than the sensor array 11.

The spatial light signal is incident on the light receiving face of the light receiver 110. The light receiver 110 converts a spatial light signal received by the light receiving face into an electric signal (hereinafter, also referred to as a signal). The light receiver 110 outputs the converted signal to a reception unit 13.

For example, the light receiver 110 is achieved by a photodiode (PD). For example, the light receiver 110 is achieved by a PN type photodiode, a PIN type photodiode, or an avalanche photodiode. The light receiver 110 may be a photodetector other than a photodiode as long as it can convert the received spatial light signal into an electric signal.

The light receiver 110 is sensitive to a wavelength band of a spatial light signal used for optical spatial communication. For example, the light receiver 110 has sensitivity to a wavelength band in the visible region. For example, the light receiver 110 may have sensitivity in an infrared region or an ultraviolet region. The wavelength band to be received by the light receiver 110 may be selected according to the wavelength band of the spatial light signal used for the optical spatial communication.

The lens 12 is disposed at a position capable of receiving a spatial light signal from the outside. The lens 12 is disposed in such a way that the light receiving face of the sensor array 11 is positioned between the main surface and the focal surface. The focal surface of the lens 12 is formed farther away from the lens 12 than the sensor array 11. The lens 12 is an optical lens that focuses the spatial light signal on the light receiving face of the sensor array 11. The spatial light signal focused by the lens 12 is applied to the light receiving face of the sensor array 11. Since the light receiving face of the sensor array 11 is disposed in front of the focal surface of the lens, the light receiving face of the sensor array 11 receives a widened spatial light signal by its surface.

The reception unit 13 receives a signal from each of the plurality of light receivers 110 constituting the sensor array 11. The reception unit 13 integrates the received signal. The reception unit 13 estimates an incoming direction of the spatial light signal received by the plurality of light receivers 110 based on the integrated signal. The reception unit 13 identifies that the communication target is located in the incoming direction of the spatial light signal. The reception unit 13 associates the identified communication target with the light receiver 110 that receives the spatial light signal from the communication target. The reception unit 13 amplifies the electric signal from the light receiver 110 associated with the communication target. The reception unit 13 decodes the amplified electric signal and analyzes a signal from the communication target.

[Reception Unit]

Figure 2:
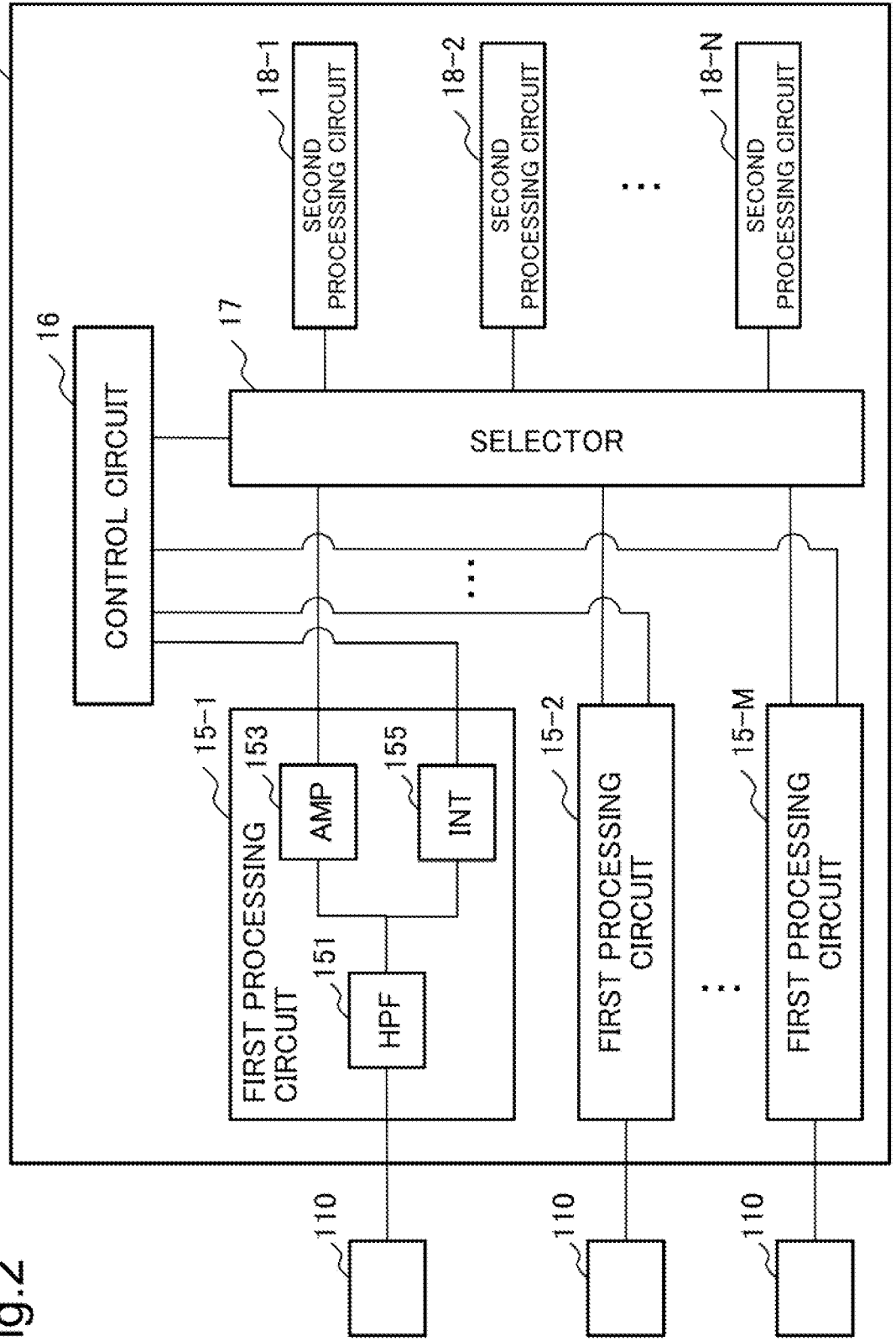
FIG. 2 is a block diagram illustrating an example of a configuration of a reception unit included in the light receiving device according to the first example embodiment.

Next, a configuration of the reception unit 13 will be described in detail with reference to the drawings. FIG. 2 is a block diagram illustrating an example of a configuration of the reception unit 13. The reception unit 13 includes a plurality of first processing circuits 15-1 to M, a control circuit 16, a selector 17, and a plurality of second processing circuits 18-1 to N (M and N are natural numbers). FIG. 2 illustrates the internal configuration of only the first processing circuit 15-1 among the plurality of first processing circuits 15-1 to M, but the internal configuration of each of the plurality of first processing circuits 15-2 to M is also similar to that of the first processing circuit 15-1.

The first processing circuit 15 includes a high-pass filter 151, an amplifier 153, and an integrator 155. In FIG. 2, the high-pass filter 151 is denoted as a high path filter (HPF), the amplifier 153 is denoted as an amplifier (AMP), and the integrator 155 is denoted by as an integrator (INT). The signal having passed through the high-pass filter 151 is input in parallel to the amplifier 153 and the integrator 155. The light receiver 110 and the first processing circuit constitute one unit for each light receiver 110.

The high-pass filter 151 acquires a signal from the light receiver 110. The high-pass filter 151 selectively passes a signal of a high frequency component corresponding to the wavelength band of the spatial light signal among the acquired signals. The high-pass filter 151 cuts off a signal derived from ambient light such as sunlight. Instead of the high-pass filter 151, a band pass filter that selectively passes a signal in a wavelength band of a spatial light signal may be configured. When saturated with intense sunlight, the spatial light signal is unreadable. Therefore, a color filter that selectively passes the light in the wavelength band of the spatial light signal may be installed at the front stage of the light receiving face of the light receiver 110. The signal that has passed through the high-pass filter 151 is supplied to the amplifier 153 and the integrator 155.

The amplifier 153 acquires the signal output from the high-pass filter 151. The amplifier 153 amplifies the acquired signal. The amplifier 153 outputs the amplified signal to the selector 17. Among the signals input to the selector 17, the signal to be received is allocated to any one of the plurality of second processing circuits 18-1 to N under the control of the control circuit 16. The signal to be received is a signal from the light receiver 110 that receives a spatial light signal from a communication device to be communicated (not illustrated). A signal from the light receiver 110 that is not used for receiving the spatial light signal is not output to the second processing circuit 18.

The integrator 155 acquires the signal output from the high-pass filter 151. The integrator 155 integrates the acquired signal. The integrator 155 outputs the integrated signal to the control circuit 16.

The integrator 155 is disposed to measure the intensity of the spatial light signal received by the light receiver 110. In the present example embodiment, the light receiving face of the sensor array 11 receives, by its surface, the spatial light signal in a state in which the beam diameter is spread, thereby increasing the speed of searching for the communication target. Since the intensity of the spatial light signal received in a state where the beam diameter is not narrowed is weaker than that of the signal a case where the beam diameter is narrowed, it is difficult to measure the voltage of the signal amplified only by the amplifier 153. By using the integrator 155, for example, the voltage of the signal can be increased to a level at which the voltage can be measured by integrating the signal for several milliseconds (msec) to several tens of milliseconds.

The control circuit 16 acquires a signal output from the integrator 155 included in each of the plurality of first processing circuits 15-1 to M. In other words, the control circuit 16 acquires a signal derived from the spatial light signal received by each of the plurality of light receivers 110. The control circuit 16 compares the readings of the signals derived from the plurality of light receivers 110 adjacent to each other, and selects the light receiver 110 having the maximum signal intensity. The control circuit 16 causes the selector 17 to allocate the signal derived from the selected light receiver 110 to any one of the plurality of second processing circuits.

The control circuit 16 selecting the light receiver 110 corresponds to estimating the incoming direction of the spatial light signal. That is, the control circuit 16 selecting the light receiver 110 corresponds to identifying the communication device that is the light transmission source of the spatial light signal. Allocating the signal derived from the selected light receiver 110 to any one of the plurality of second processing circuits corresponds to associating the identified communication target with the light receiver 110 that receives the spatial light signal from the communication target. That is, the control circuit 16 identifies the communication device that is the light transmission source of the spatial light signal based on the spatial light signal received by the sensor array 11. For example, when a communication device (not illustrated) on which the light receiving device 10 of the present example embodiment is mounted identifies a communication device (not illustrated) that is a light transmission source of the spatial light signal, the communication device transmits the spatial light signal to the identified communication device.

A signal amplified by the amplifiers 153 included in each of the plurality of first processing circuits 15-1 to M is input to the selector 17. The selector 17 outputs a signal to be received among the input signals to any one of the plurality of second processing circuits 18-1 to N according to the control of the control circuit 16. A signal not to be received is not output from the selector 17.

A signal derived from the light receiver 110 allocated by the control circuit 16 is input to the second processing circuit 18. The second processing circuit 18 decodes the input signal. The second processing circuit 18 may be configured to perform some signal processing on the decoded signal, or may be configured to output the decoded signal to an external signal processing device or the like (not illustrated).

When the selector 17 selects a signal derived from the light receiver 110 selected by the control circuit 16, one second processing circuit is allocated to one communication target. That is, the control circuit 16 allocates a signal derived from the spatial light signal, from each of the plurality of communication targets, received by the sensor arrays 11 to any one of the plurality of second processing circuits 18-1 to N. As a result, the light receiving device 10 can simultaneously read signals derived from spatial light signals from a plurality of communication targets on individual channels. In a general method, spatial light signals from a plurality of communication targets are read in a time division manner in one channel. On the other hand, in the method of the present example embodiment, since spatial light signals from a plurality of communication targets are simultaneously read in a plurality of channels, the transmission speed is improved. The method of the present example embodiment may be configured to receive signals in a time division manner according to the situation.

For example, the scan of the communication target using the integrator 155 may be performed as a primary scan, and the incoming direction of the spatial light signal may be identified with coarse accuracy. Then, secondary scanning with fine accuracy may be performed in the identified direction to identify a more accurate position of the communication target. When communication with the communication target is possible, an accurate position of the communication target can be determined by exchanging signals with the communication target. For example, in a case where the light receiving device 10 is mounted on the mobile body, when the position of the communication target can be determined, the moving direction, the speed, and the like of each other can be shared through communication with the communication target. When the moving directions, speeds, and the like can be shared, the mutual positional relationship can be predictively controlled with higher accuracy.

[Integrator]

Figure 3:
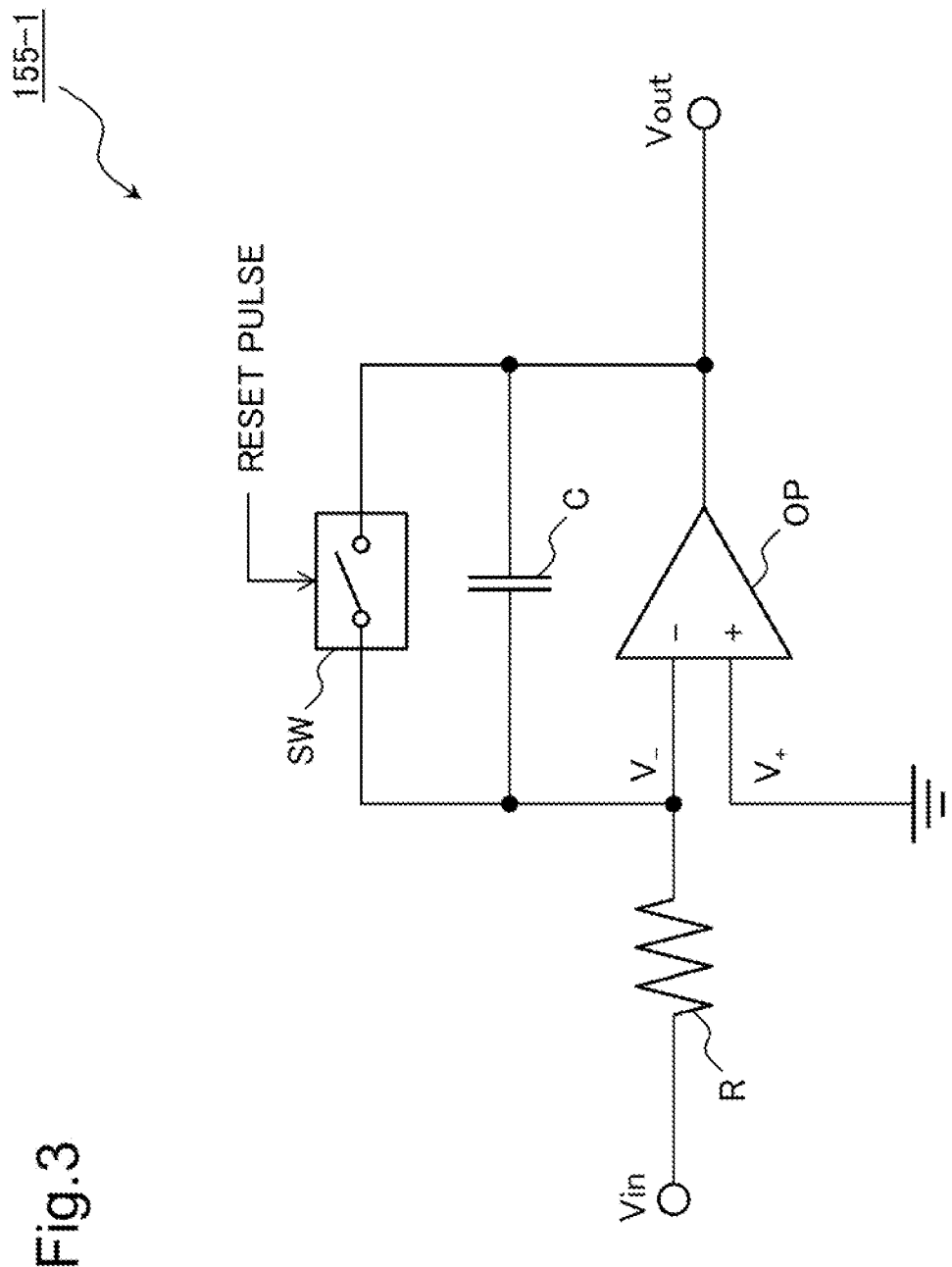
FIG. 3 is a block diagram illustrating an example of a configuration of an integration circuit included in a first processing circuit of the light receiving device according to the first example embodiment.

Next, an example of a circuit configuration of the integrator 155 will be described with reference to the drawings. FIG. 3 is an example of a circuit configuration of the integrator 155 (integrator 155-1). The integrator 155-1 includes a resistor R, an operational amplifier OP, a capacitor C, and a switch SW. In FIG. 3, regarding the resistor R, the capacitor C, and the switch SW, the left terminal is referred to as a first end, and the right terminal is referred to as a second end. The operational amplifier OP has an inverting input terminal V−, a non-inverting input terminal V+, and an output terminal.

The first end of the resistor R is connected to an input end Vin. The second end of the resistor R is connected to the inverting input terminal V− of the operational amplifier OP, the first end of the capacitor C, and the first end of the switch SW. The inverting input terminal V− of the operational amplifier OP is connected to the second end of the resistor R, the first end of the capacitor C, and the first end of the switch SW. The non-inverting input terminal V+ of the operational amplifier is grounded. The output terminal of the operational amplifier OP is connected to an output end Vout, the second end of the capacitor, and the second end of the switch SW. The first end of the capacitor is connected to the second end of the resistor R, the inverting input terminal V− of the operational amplifier OP, and the first end of the switch SW. The second end of the capacitor is connected to the output terminal of the operational amplifier OP, the second end of the switch SW, and the output end Vout. The first end of the switch SW is connected to the second end of the resistor R, the first end of the capacitor C, and the inverting input terminal V− of the operational amplifier OP. The second end of the switch SW is connected to the second end of the capacitor C, the output terminal of the operational amplifier OP, and the output end Vout.

A reset pulse is applied to the switch SW at a predetermined timing. The switch SW is closed only for a predetermined period (reset time Trst) after the reset pulse is applied. The time during which the switch is open corresponds to an integration time Tint. The reset time Trst is set to be shorter than the integration time Tint.

Figure 4:
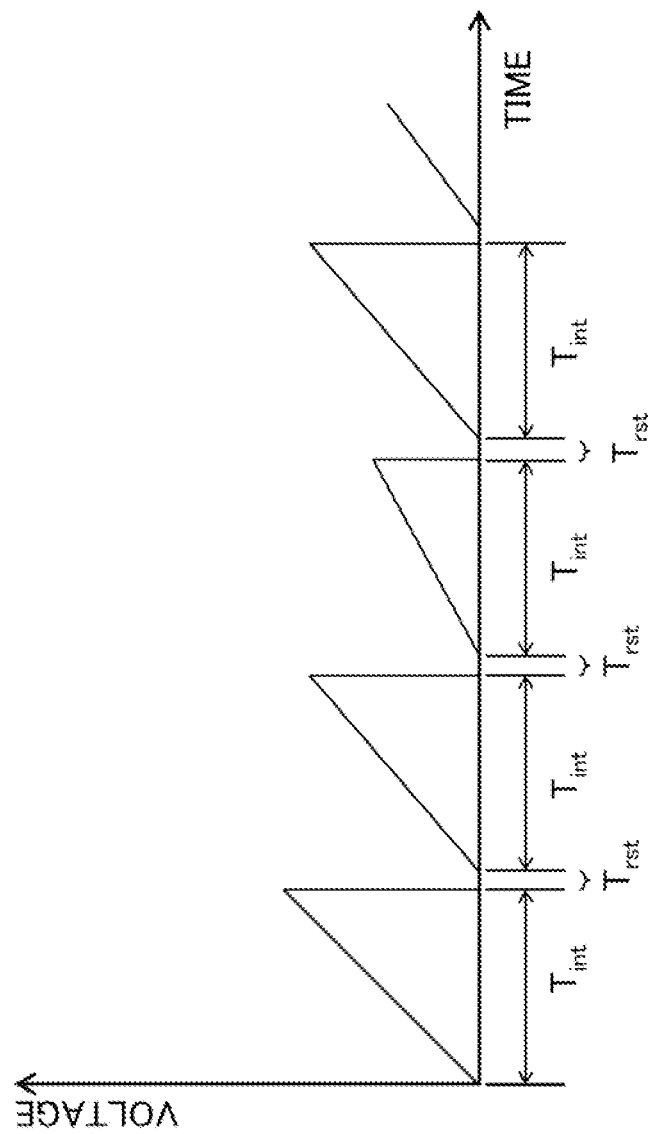
FIG. 4 is a graph for explaining an operation of an integrator included in the first processing circuit of the light receiving device according to the first example embodiment.

FIG. 4 is a graph for explaining the operation of the integrator 155-1. FIG. 4 illustrates a negative feedback reset operation of the integrator 155-1 including the operational amplifier OP. The integrator 155-1 functions as a kind of low-pass filter. The integrator 155-1 accumulates the charge in the capacitor C during the integration time Tint. When a reset pulse is applied to the switch SW, the charge accumulated in the capacitor C is reset. For example, when a voltage value immediately before resetting is read by an analog-digital (AD) converter (not illustrated), the voltage of the signal can be measured.

[Direction Detection]

Figure 5:
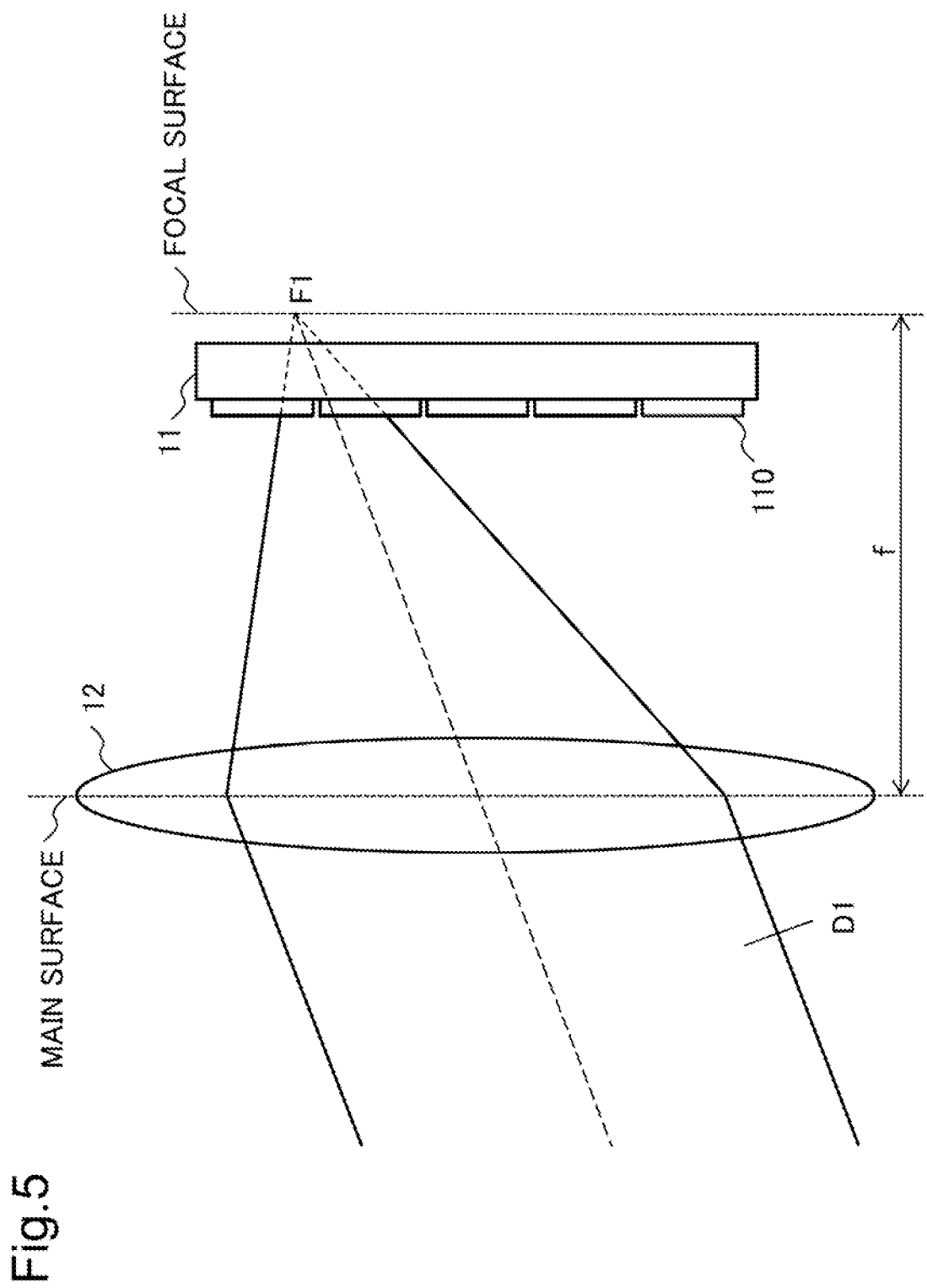
FIG. 5 is a conceptual diagram for describing an example of direction detection of a spatial light signal by the light receiving device according to the first example embodiment.
Figure 6:
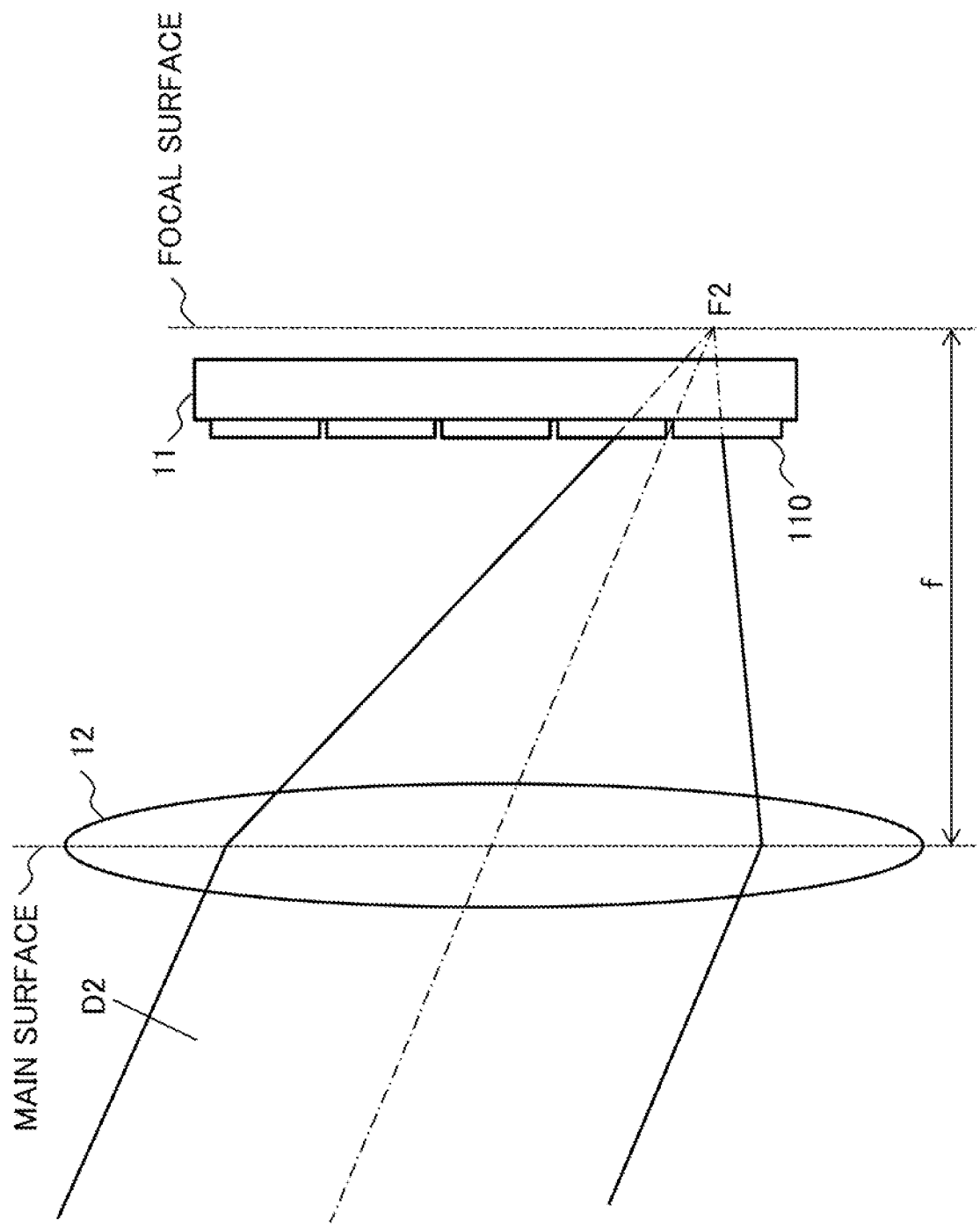
FIG. 6 is a conceptual diagram for describing another example of direction detection of a spatial light signal by the light receiving device according to the first example embodiment.

Next, direction detection by the light receiving device 10 will be described with reference to the drawings. FIGS. 5 and 6 are conceptual diagrams illustrating a state in which a spatial light signal is incident on the lens 12 included in the light receiving device 10 and the spatial light signal is received by the sensor array 11. The distance between the main surface of the lens 12 and the focal surface corresponds to a focal length f. As illustrated in FIGS. 5 and 6, the sensor array 11 is disposed in such a way that the light receiving faces of the plurality of light receivers 110 are located between the main surface and the focal surface.

The example of FIG. 5 is an example in which a spatial light signal D1 comes from below the lens 12. The spatial light signal D1 having passed through the lens 12 is focused toward a focal point F1 on the focal surface of the lens 12. The light receiving faces of the upper light receivers 110 among the plurality of light receivers 110 receive the spatial light signal D1 by its surface.

FIG. 6 illustrates an example in which a spatial light signal D2 comes from above the lens 12. The spatial light signal D2 having passed through the lens 12 is focused toward a focal point F2 on the focal surface of the lens 12. The light receiving faces of the lower light receivers 110 among the plurality of light receivers 110 receive the spatial light signal D2 by its surface.

Figure 7:
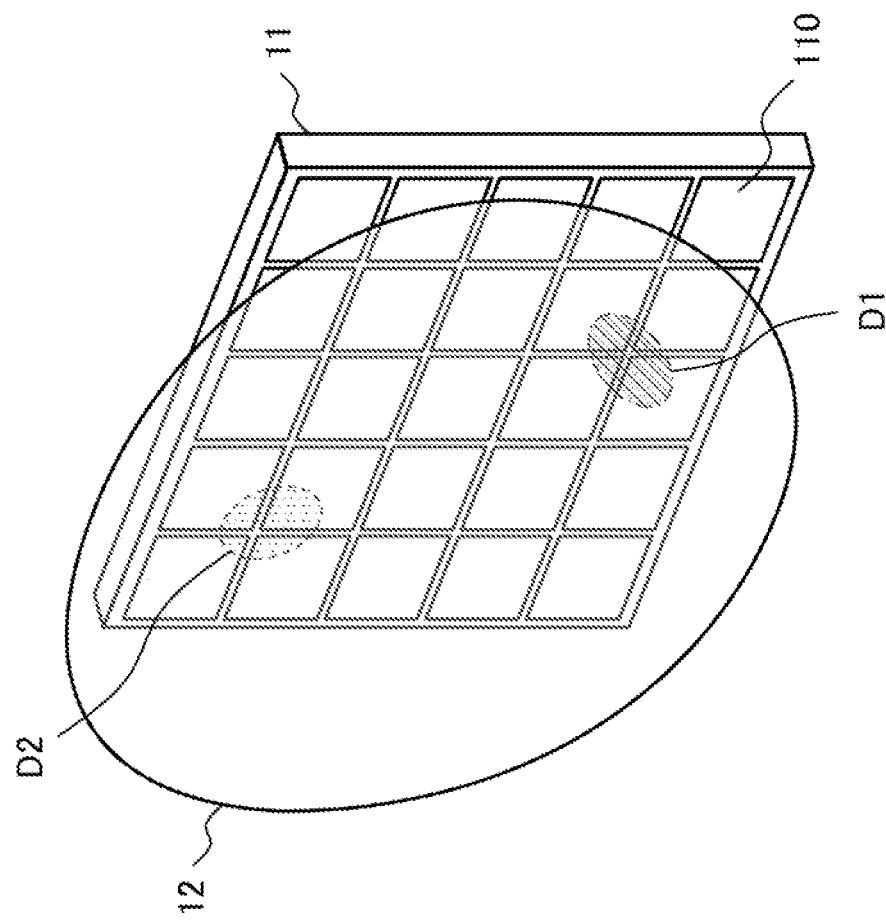
FIG. 7 is a perspective view illustrating a positional relationship between a lens and a sensor array of the light receiving device according to the first example embodiment.

FIG. 7 is a perspective view of the light receiving face of the sensor array 11 when viewed through the lens 12. In the example of FIG. 7, the spatial light signal D1 is received by the plurality of lower light receivers 110 of the sensor array 11, and the spatial light signal is received by the plurality of upper left light receivers 110 of the sensor array 11. As illustrated in FIG. 7, on the light receiving face of the sensor array 11, the spatial light signal is received not only at a position in the vertical direction but also at a position corresponding to the incoming direction in the horizontal direction.

The spatial light signal arriving from the distance is substantially collimated. Therefore, by detecting the position where the spatial light signal is collected by the sensor array 11, it is possible to estimate from which direction the spatial light signal has come. The spatial light signal collected by the lens 12 is received by the light receiving faces of the plurality of light receivers 110. The incoming direction of the spatial light signal can be estimated from the intensity ratio of the spatial light signals received by the respective light receivers 110. When the communication device to be communicated is associated with the incoming direction of the spatial light signal, the light receiver 110 and the communication device can be associated with each other.

Figure 8:
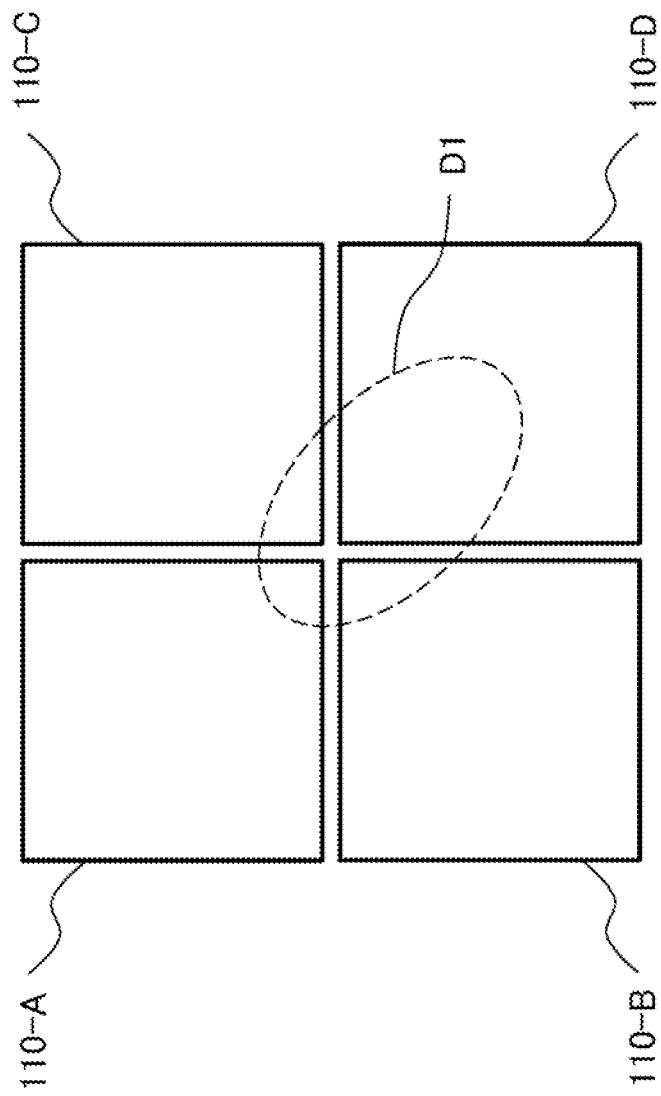
FIG. 8 is a conceptual diagram illustrating an example of reception of a spatial light signal in the sensor array of the light receiving device according to the first example embodiment.

FIG. 8 illustrates an example in which the light receiving faces of a light receiver 110-A, a light receiver 110-B, a light receiver 110-C, and a light receiver 110-D adjacent to each other receives the spatial light signal D1. In the case of the example of FIG. 8, the light receiving area of the light receiver 110-D is maximum. Therefore, for the light receiver 110-D, the signal intensity at the spatial light signal D1 is maximized. In this case, the light receiving device 10 determines that the light receiver 110-D receives the spatial light signal D1. When the incoming direction of the spatial light signal and the light receiver 110 are associated with each other based on the positional relationship between the sensor array 11 and the lens 12, the incoming direction of the spatial light signal can be estimated according to the position of the light receiver 110 at which the signal intensity is maximized.

In a case where a plurality of communication targets is close to each other, or in a case where another communication target is located between the light receiving device 10 and the communication target, positions where the plurality of spatial light signals is collected may overlap with each other. In such a case, a plurality of overlapping spatial light signals may be separated according to the situation. It is assumed that it can be determined that the plurality of spatial light signals is received based on identification information or the like included in each of the plurality of spatial light signals.

Figure 9:
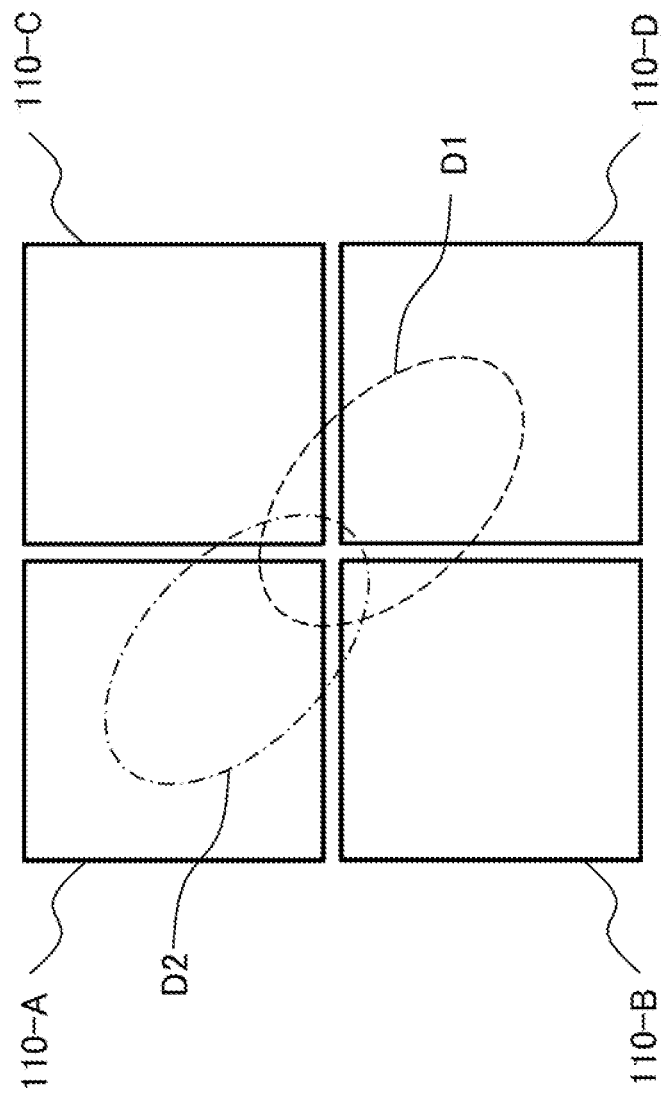
FIG. 9 is a conceptual diagram illustrating another example of reception of a spatial light signal in the sensor array of the light receiving device according to the first example embodiment.

FIG. 9 illustrates an example in which the light receiving regions of the spatial light signal D1 and the spatial light signal D2 partially overlap. In the example of FIG. 9, the light receiver 110-D has the maximum signal intensity of the spatial light signal D1, and the light receiver 110-A has the maximum signal intensity of the spatial light signal D2. The light receiving device 10 determines that the light receiver 110-D receives the spatial light signal D1, and determines that the light receiver 110-A receives the spatial light signal D2. In the example of FIG. 9, since the degree of overlapping of the light receiving regions is slight, the spatial light signal D1 and the spatial light signal D2 can be separated without time division.

Figure 10:
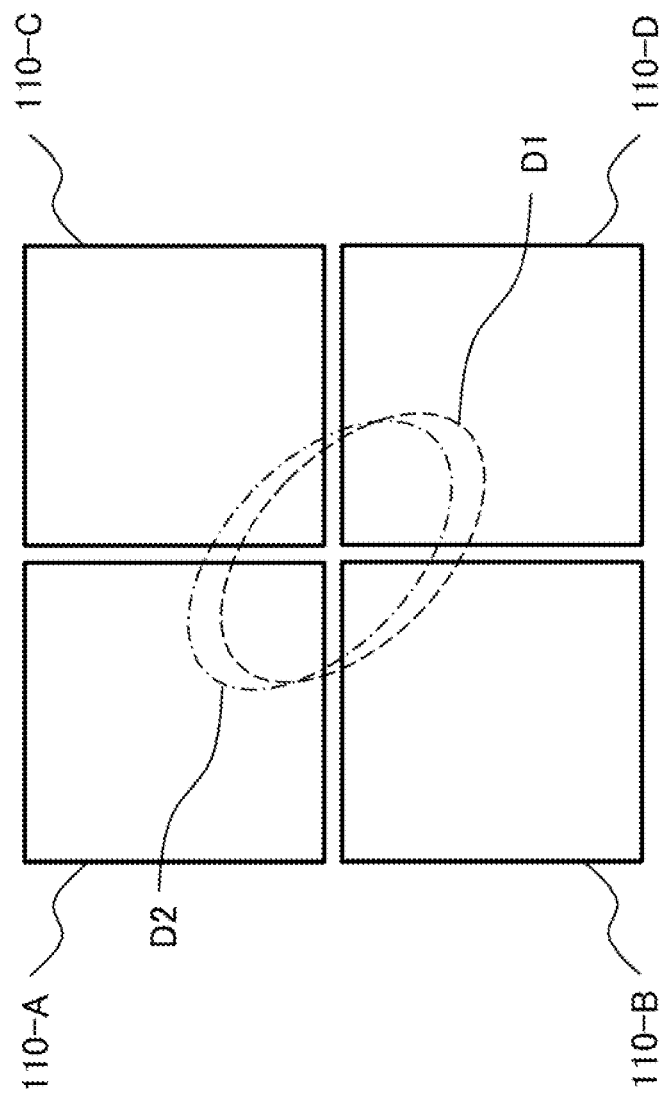
FIG. 10 is a conceptual diagram illustrating still another example of reception of a spatial light signal in the sensor array of the light receiving device according to the first example embodiment.

FIG. 10 illustrates an example in which most of the light receiving regions of the spatial light signal D1 and the spatial light signal D2 overlap each other. In the case of the example of FIG. 10, the spatial light signal D1 and the spatial light signal D2 cannot be separated based on the signal intensities of the spatial light signal D1 and the spatial light signal D2. In such a case, the spatial light signal D1 and the spatial light signal D2 can be separated by time-dividing reception timings of the spatial light signal D1 and the spatial light signal D2. At least any one of a plurality of communication targets having overlapping light receiving regions may be notified to be shifted in position.

As described above, the light receiving device of the present example embodiment includes the sensor array, the lens, and the reception unit. The lens collects the spatial light signal. The sensor array includes a plurality of light receivers that receive spatial light signal collected by the lenses. The reception unit integrates the electric signal derived from the spatial light signal received by each of the plurality of light receivers, and selects, according to a voltage value of the integrated electric signal, a light receiver that receives the spatial light signal.

In the light receiving device of the present example embodiment, the spatial light signal condensed by the lens is received by at least any one of the plurality of light receivers. The light receiving device of the present example embodiment integrates the electric signal derived from the spatial light signal, and selects, according to the voltage value of the integrated electric signal, a light receiver that receives the spatial light signal. According to the light receiving device of the present example embodiment, it is possible to collectively receive the spatial light signals from the plurality of communication targets and collectively distinguish the light transmission sources of the spatial light signals. Therefore, according to the light receiving device of the present example embodiment, spatial light signals coming from various directions can be efficiently received.

In an aspect of the present example embodiment, the light receiving faces of the plurality of light receivers are disposed in an array on the same plane in the same direction. The lens is disposed in such a way that the light receiving faces of the plurality of light receivers are positioned between the main surface and the focal surface of the lens.

According to the present aspect, by integrating the electric signal derived from the spatial light signal, even when the spatial light signal is received by the surface, the voltage value of the spatial light signal can be measured. Therefore, according to the present aspect, since the spatial light signal can be received at a wide light receiving angle, utilization efficiency of light is higher than that in a case where the spatial light signal is received at a point.

In an aspect of the present example embodiment, the reception unit includes a plurality of first processing circuits, a selector, a second processing circuit, and a control circuit.

The plurality of first processing circuits is associated with the plurality of respective light receivers, amplifies the electric signals derived from the spatial light signal received by the plurality of respective light receivers, and integrates each of the electric signals. The selector receives the electric signals amplified by the first processing circuit and selectively outputs at least any one of the received electric signals. The second processing circuit decodes the electric signal output from the selector. The control circuit selects, according to the voltage value of the electric signal integrated by each of the plurality of first processing circuits, a light receiver that receives the spatial light signal. The control circuit causes the selector to allocate the electric signal from the selected light receiver to any one of the plurality of second processing circuits.

In an aspect of the present example embodiment, in a case where the spatial light signal is received by the plurality of light receivers adjacent to each other, the control circuit selects a light receiver having a maximum voltage value among voltage values of the electric signals integrated by the plurality of first processing circuits as the light receiver that receives the spatial light signal. For example, in a case where the spatial light signals from the plurality of light transmission sources are received by the plurality of light receivers adjacent to each other, the control circuit selects, according to the voltage value of the electric signal integrated by each of the plurality of first processing circuits, a light receiver that receives the spatial light signal for each light transmission source. For example, in a case where the control circuit is not allowed to select, according to the voltage value of the electric signal integrated by each of the plurality of first processing circuits, a light receiver that receives the spatial light signal for each light transmission source, the control circuit causes the same light receiver to receive the spatial light signal in a time division manner for each light transmission source.

According to the present aspect, the spatial light signal, from the single light transmission source, received by the plurality of light receivers can be allocated to any one of the light receivers. According to the present aspect, the spatial light signals, from the plurality of light transmission sources, received by the plurality of light receivers can be allocated to any one of the light receivers.

Second Example Embodiment

Next, a light receiving device according to the second example embodiment will be described with reference to the drawings. The light receiving device of the present example embodiment is different from that of the first example embodiment in that it includes a light pipe. The light pipe is a member that guides a spatial light signal received in a gap between the plurality of light receivers constituting the sensor array to each of the plurality of light receivers constituting the sensor array.

Figure 11:
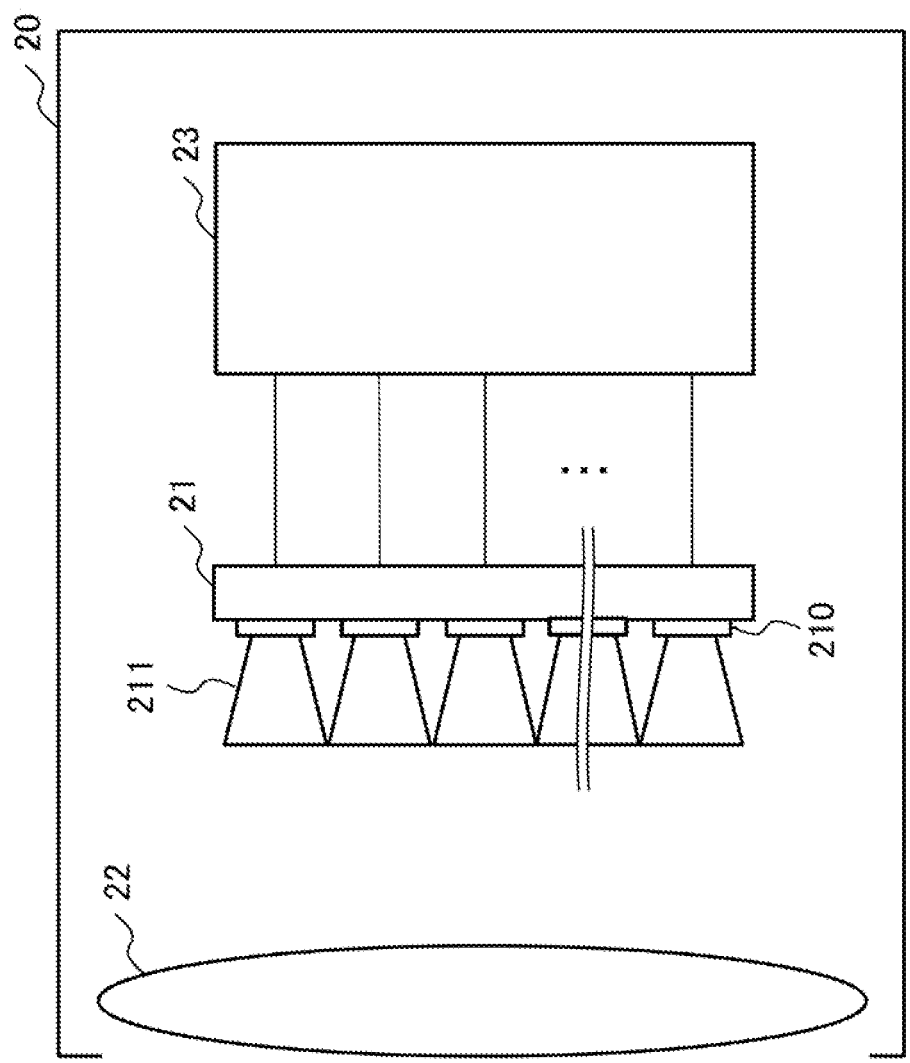
FIG. 11 is a conceptual diagram illustrating an example of a configuration of a light receiving device according to the second example embodiment.

FIG. 11 is a conceptual diagram illustrating an example of a configuration of a light receiving device 20 of the present example embodiment. The light receiving device 20 includes a sensor array 21, a lens 22, and a reception unit 23. The sensor array 21 includes a plurality of light receivers 210 and a plurality of light pipes 211. The light pipe 211 is disposed in each of the plurality of light receivers 210. Main functions of the sensor array 21, the lens 22, and the reception unit 23 are similar to those in the first example embodiment. Hereinafter, description will be given focusing on the light pipe 211 that is not included in the light receiving device 10 of the first example embodiment.

A gap corresponding to the size of the light receiving face of the light receiver 210 is generated between the plurality of light receivers 210 constituting the sensor array 21. When the light receiving face is large, the gap between the adjacent light receivers 210 is small. When the light receiving face is small, the gap between the adjacent light receivers 210 is large. In a case where the spatial light signal is directly incident on the light receiving face of the sensor array 21, when the gap between the adjacent light receivers 210 is large as compared with the spot diameter of the spatial light signal condensed on the light receiving face, the spot of the spatial light signal entering the gap is not detected. When the spot diameter of the spatial light signal condensed on the light receiving face of the sensor array 21 is large, the intensity of the spatial light signal received by each light receiver 210 decreases. Therefore, when the spatial light signal is directly incident on the light receiving face of the sensor array 21, it is necessary to optimize the size of the gap between the adjacent light receivers 210 and the spot diameter of the spatial light signal.

Figure 12:
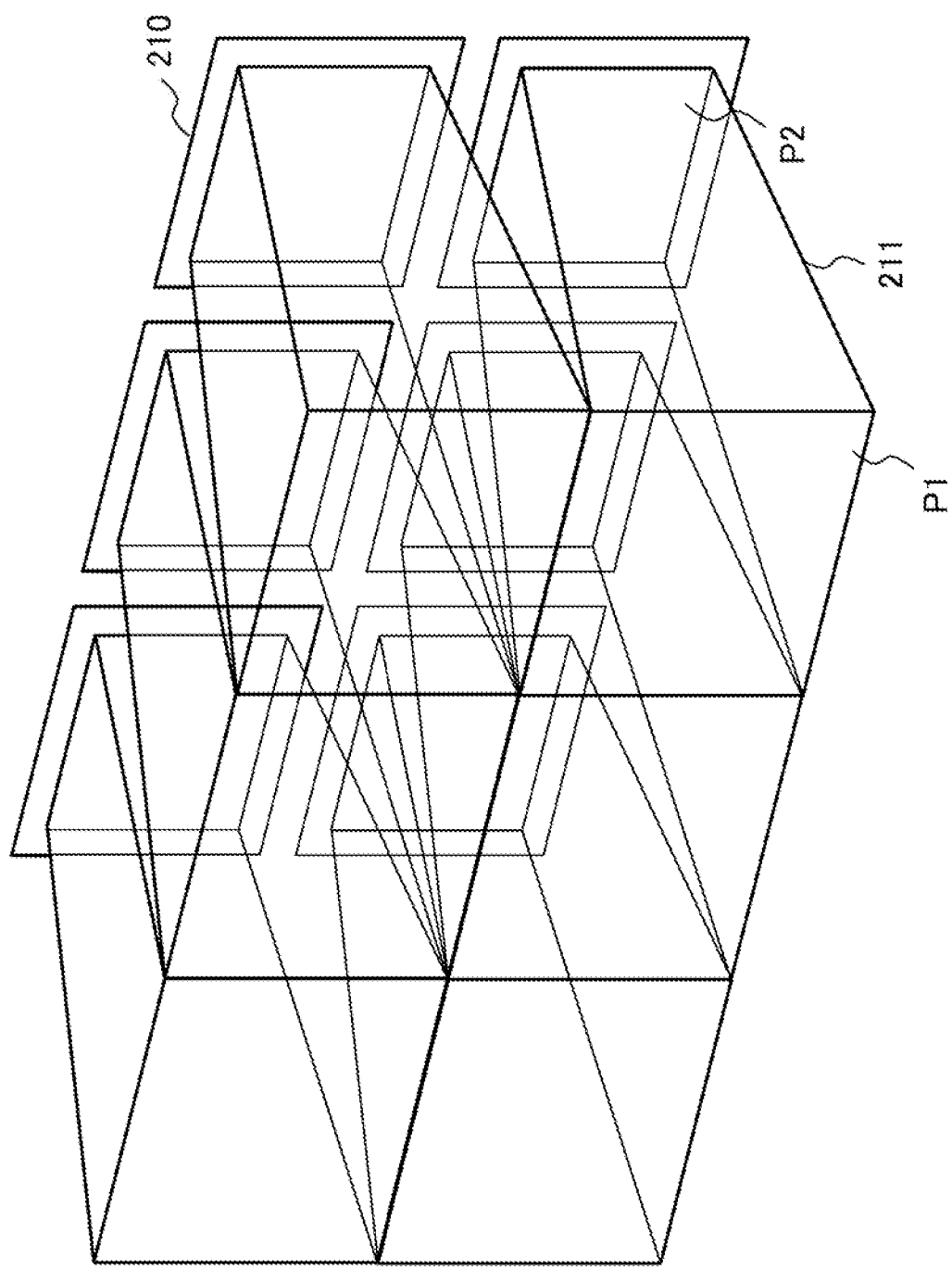
FIG. 12 is a conceptual diagram for describing an arrangement of a light receiver and a light pipe included in a sensor array of the light receiving device according to the second example embodiment.

FIG. 12 is a perspective view of a state in which the light pipes 211 are installed on the light receiving faces of the plurality of respective light receivers 210. The light pipe 211 is provided in association with each of the plurality of light receivers 210. The light pipe 211 has an incident face P1 on which a spatial light signal is incident and an outgoing face P2 from which a light signal guided inside the light pipe 211 is emitted. The outgoing face P2 of the light pipe 211 is disposed in contact with the light receiving face of the light receiver 210 with which the light pipe 211 is associated. As long as the light signal emitted from the outgoing face P2 of the light pipe 211 is incident on the light receiving face of the light receiver 210, the outgoing face P2 of the light pipe 211 and the light receiving face of the light receiver 210 may not be in contact with each other.

The adjacent light pipes 211 are disposed in such a way that there is no gap between the incident faces P1. The focal surface of the lens 22 may be formed closer to the sensor array 21 than the incident face P1 of the light pipe 211. The focal surface of the lens 22 may be formed in front of the light receiving face of the sensor array 21 when viewed from the lens 22. Although FIG. 12 illustrates an example in which the incident face P1 and the outgoing face P2 are parallel to each other, the incident face P1 and the outgoing face P2 may be non-parallel as long as the light signal can be guided from the incident face P1 toward the outgoing face P2.

For example, the light pipe 211 can be made of a material of a general optical fiber. The light pipe 211 is preferably made of a material that easily transmits light in the wavelength band of the spatial light signal. The inner face of the light pipe 211 is a mirror surface that reflects a light signal guided inside the light pipe 211. A light signal derived from the spatial light signal incident from the incident face P1 of the light pipe 211 is guided to the outgoing face P2 while being reflected by the inner face of the light pipe 211. The light signal guided to the outgoing face P2 is emitted from the outgoing face P2.

An anti-reflection layer corresponding to the wavelength band of the spatial light signal may be provided on the incident face P1 of the light pipe 211. When the anti-reflection layer is provided on the incident face P1, the spatial light signal reflected by the incident face P1 can be reduced. A color filter that selectively passes light in the wavelength band of the spatial light signal may be provided on the incident face P1 of the light pipe 211. When the color filter is provided on the incident face P1, the light in the wavelength band of the spatial light signal is selectively guided to the light receiving face of the light receiver 210, so that the noise component included in the spatial light signal can be removed.

When the light pipe 211 is used, the light receiving face of the light receiver 210 can be reduced. Therefore, the light receiver 210 having a small light receiving face can be configured while having the same light receiving efficiency. Therefore, when the light pipe 211 is used, options of the light receiver 210 are widened. For example, when the light pipe 211 is used, the light receiver 210 having a small light receiving face but high sensitivity can be used.

As described above, the sensor array of the light receiving device of the present example embodiment includes the plurality of light pipes that is associated with the respective light receiving faces of the plurality of respective light receivers, and each guides the spatial light signal to each of the light receiving faces of the plurality of light receivers. For example, each of the plurality of light pipes includes an incident face on which the spatial light signal is incident and an outgoing face from which the light signal incident from the incident face and guided is emitted, and the light pipes are disposed in such a way that the incident faces form the same plane without a gap. For example, each of the plurality of light pipes is disposed with the outgoing face facing the associated light receiving face.

According to the light receiving device of the present example embodiment, by installing the light pipes on the light receiving faces of the plurality of light receiving units, the light signal derived from the spatial light signal can be guided to the light receiving face of each light receiving unit without optimizing the size of the gap between the adjacent light receiving units and the spot diameter of the spatial light signal. Therefore, according to the light receiving device of the present example embodiment, the spatial light signal can be received more efficiently.

Third Example Embodiment

Next, a communication device according to a third example embodiment will be described with reference to the drawings. The communication device of the present example embodiment includes the light receiving device (also referred to as a light receiving unit) of each of the first and second example embodiments.

Figure 13:
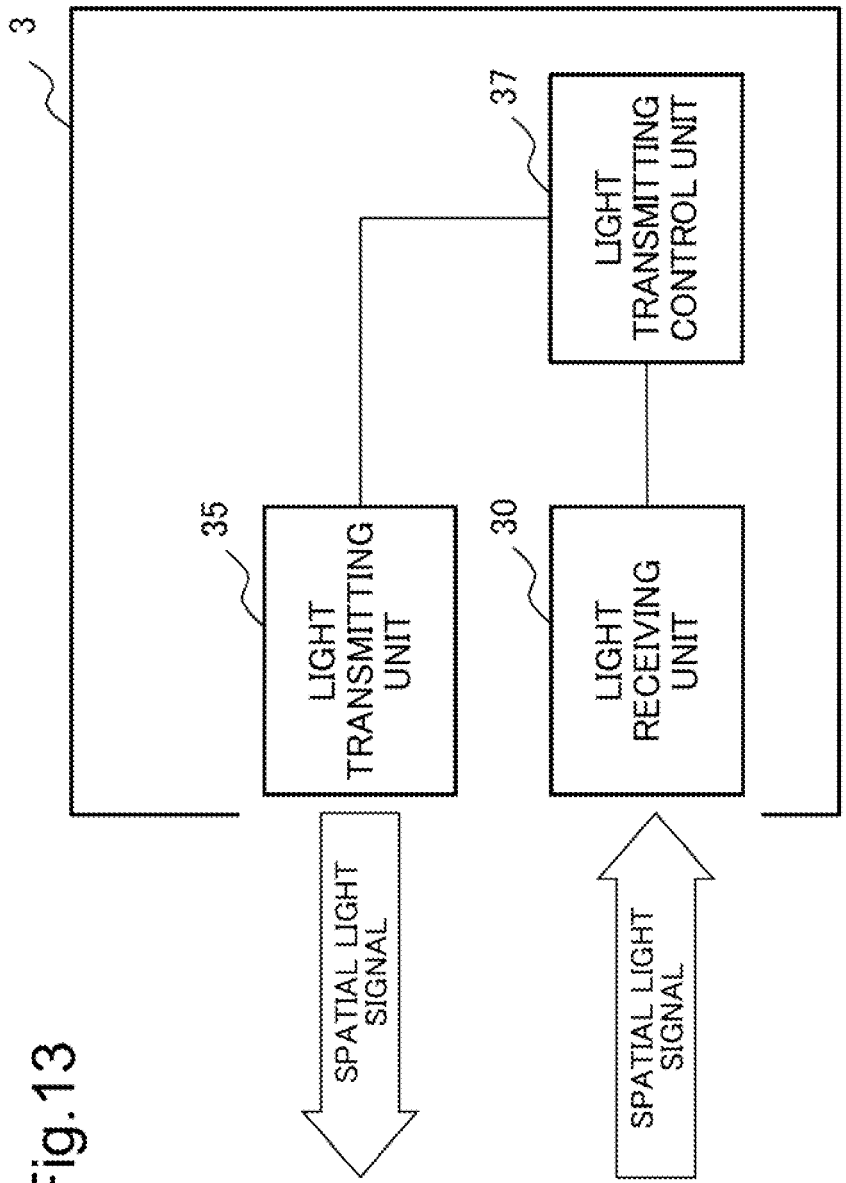
FIG. 13 is a conceptual diagram illustrating an example of a configuration of a communication device according to the third example embodiment.

FIG. 13 is a block diagram illustrating an example of a configuration of a communication device 3 of the present example embodiment. The communication device 3 includes a light receiving unit 30, a light transmitting unit 35, and a light transmitting control unit 37. The light receiving unit 30 corresponds to the light receiving device of the first example embodiment or the light receiving device 20 of the second example embodiment. Details of the light receiving unit 30 will not be described below.

The light receiving unit 30 receives the spatial light signal transmitted from the communication device to be communicated. The light receiving unit 30 decodes a signal based on the received spatial light signal to output the decoded signal to the light transmitting control unit 37. The light transmitting unit 35 transmits the spatial light signal under the control of the light transmitting control unit 37. The light transmitting control unit 37 acquires a signal from the light receiving unit 30. The light transmitting control unit 37 controls the light transmitting unit 35 according to a signal from the light receiving unit 30.

[Light Transmitting Unit]

Figure 14:
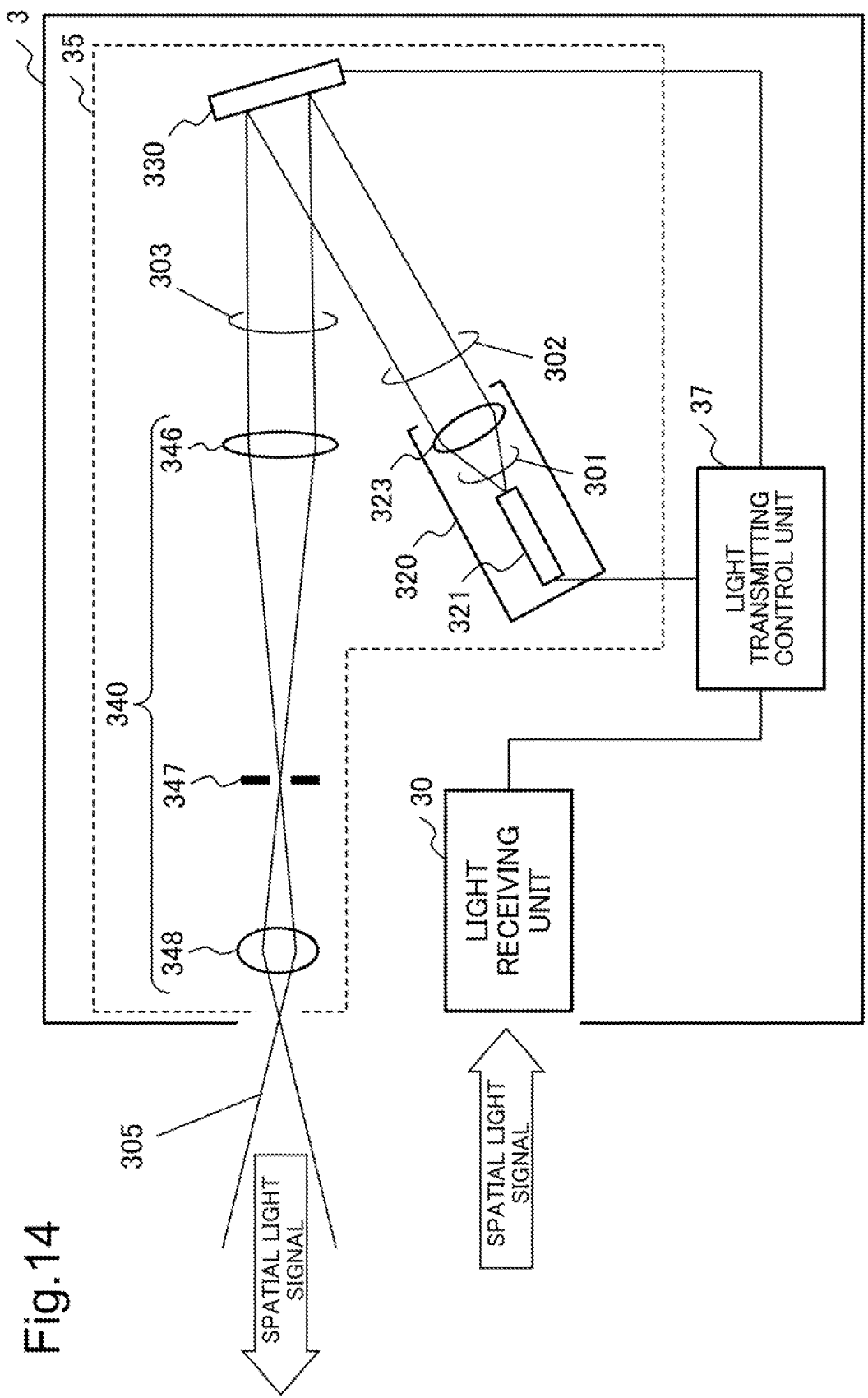
FIG. 14 is a conceptual diagram illustrating an example of a configuration of the light transmitting unit included in the communication device according to the third example embodiment.

Next, an example of a configuration of the light transmitting unit will be described with reference to the drawings. FIG. 14 is a conceptual diagram illustrating an example of a configuration of the light transmitting unit 35. The light transmitting unit 35 includes a light source 320, a spatial light modulator 330, and a projection optical system 340. FIG. 14 is conceptual, and does not accurately represent the positional relationship between the components, the traveling direction of light, and the like.

The light source 320 includes an emitter 321 and a collimator 323. The emitter 321 emits laser light 301 of a predetermined wavelength band used for spatial light communication according to the control of the light transmitting control unit 37. The collimator 323 converts the laser light 301 emitted from the emitter 321 into collimated beam 302. The laser light 301 emitted from the emitter 321 is converted into the collimated beam 302 by the collimator 323, and emitted from the light source 320. The collimated beam 302 emitted from the light source 320 travels toward the modulation unit of the spatial light modulator 330.

As illustrated in FIG. 14, the incident angle of the collimated beam 302 is non-perpendicular to the irradiated surface of the modulation unit of the spatial light modulator 330. That is, the emission axis of the collimated beam 302 emitted from the light source 320 is oblique to the irradiated surface of the modulation unit of the spatial light modulator 330. When the emission axis of the collimated beam 302 is oblique to the irradiated surface of the modulation unit of the spatial light modulator 330, the collimated beam 302 can be incident on the irradiated surface without using a beam splitter, so that the utilization efficiency of light can be improved. When the emission axis of the collimated beam 302 is set obliquely with respect to the irradiated surface of the modulation unit of the spatial light modulator 330, the size of the light transmitting unit can be made compact.

The spatial light modulator 330 includes a modulation unit irradiated with the collimated beam 302. In the modulation unit of the spatial light modulator 330, a pattern corresponding to the detection light is set according to the control of the light transmitting control unit 37. For example, the spatial light modulator 330 is achieved by a spatial light modulator including ferroelectric liquid crystal, homogeneous liquid crystal, vertical alignment liquid crystal, or the like. For example, the spatial light modulator 330 can be achieved by liquid crystal on silicon (LCOS). The spatial light modulator 330 may be achieved by a micro electro mechanical system (MEMS).

The projection optical system 340 is an optical system that projects modulated light 303 modulated by the spatial light modulator 330 as a spatial light signal 305. As illustrated in FIG. 14, the projection optical system 340 includes a Fourier transform lens 346, an aperture 347, and a projection lens 348.

The Fourier transform lens 346 is an optical lens that forms an image formed when the modulated light 303 modulated by the spatial light modulator 330 is projected at infinity at a focal position near the aperture 347.

The aperture 347 is a frame that shields high order light included in the light focused by the Fourier transform lens 346 and limits the outer edge of the display region. The opening of the aperture 347 is opened smaller than the outer periphery of the display region at the position of the aperture 347, and is installed in such a way as to block the peripheral region of the image at the position of the aperture 347. For example, the opening of the aperture 347 is formed in a rectangular shape or a circular shape. The aperture 347 is preferably installed at a focal position of the Fourier transform lens 346. The aperture 347 may be shifted from the focal position of the Fourier transform lens 346 as long as high order light can be shielded and the display region can be limited.

The projection lens 348 is an optical lens that magnifies the light focused by the Fourier transform lens 346. The projection lens 348 enlarges the spatial light signal 305 in such a way that an image corresponding to the phase image set in the modulation unit of the spatial light modulator 330 is formed on the face to be projected.

[Light Transmitting Control Unit]

Figure 15:
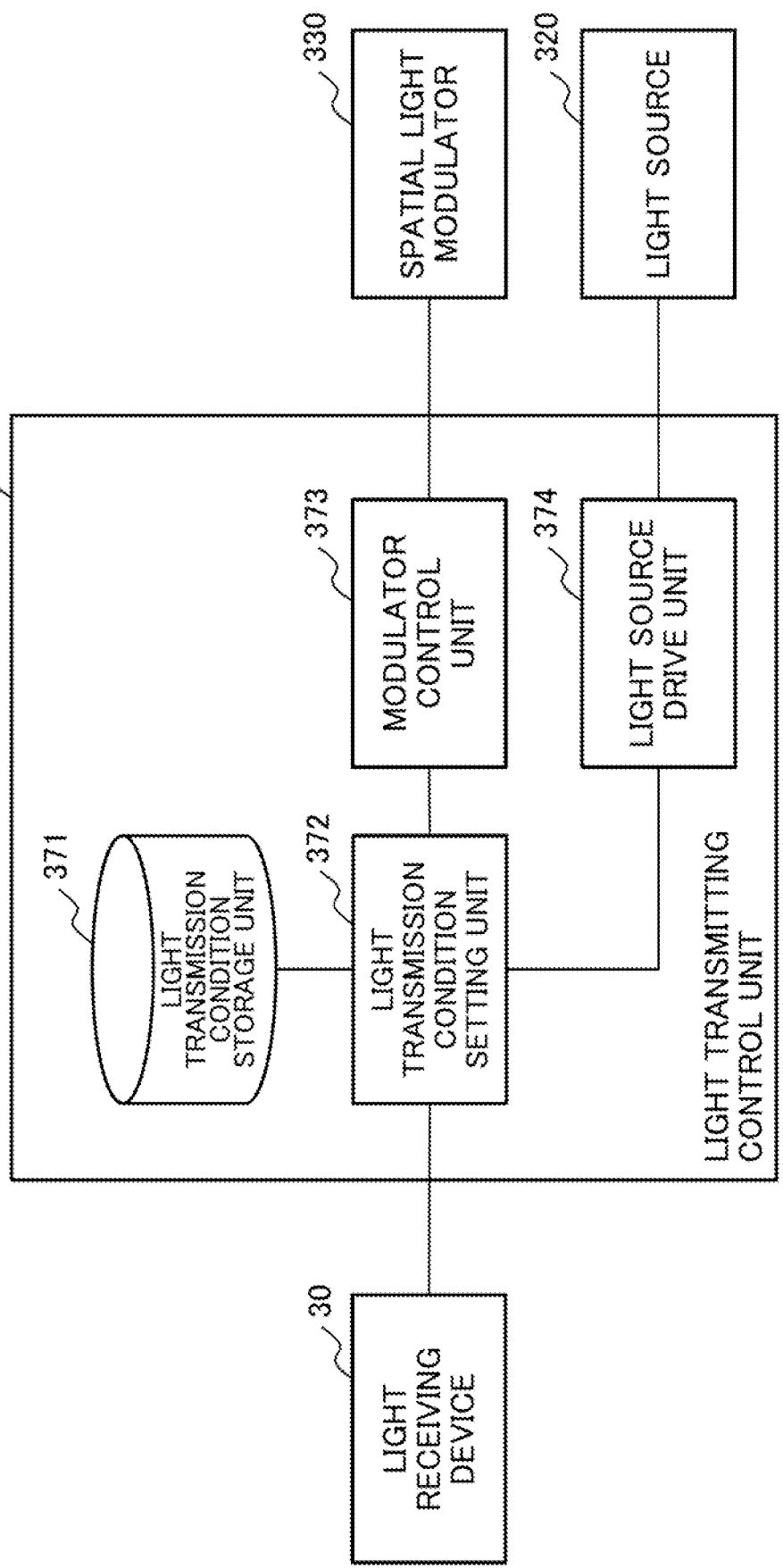
FIG. 15 is a conceptual diagram illustrating an example of a configuration of a light transmitting control unit included in the communication device according to the third example embodiment.

Next, an example of a configuration of the light transmitting control unit 37 will be described with reference to the drawings. FIG. 15 is a block diagram illustrating an example of a configuration of the light transmitting control unit 37. The light transmitting control unit 37 includes a light transmission condition storage unit 371, a light transmission condition setting unit 372, a modulator control unit 373, and a light source drive unit 374.

The light transmission condition storage unit 371 stores a pattern corresponding to the spatial light signal 305. In a case where the spatial light modulator 330 is of the phase modulation type, the light transmission condition storage unit 371 stores a phase distribution corresponding to the spatial light signal 305. The light transmission condition storage unit 371 stores a light transmission condition including a light source control condition for controlling the light source 320 and a modulation element control condition for controlling the spatial light modulator 330. The modulation element control condition is a control condition for setting a pattern corresponding to the spatial light signal 305 in the modulation unit of the spatial light modulator 330. The light source control condition is a control condition for emitting the laser light 301 from the light source 320.

The light transmission condition setting unit 372 sets a light transmission condition for transmitting the spatial light signal 305. The light transmission condition setting unit 372 sets a modulation element control condition in the modulator control unit 373. The light transmission condition setting unit 372 sets a light source control condition in the light source drive unit 374. The light transmission condition setting unit 372 matches the timing at which the modulation element control condition is set in the modulator control unit 373 with the timing at which the light source control condition is set in the light source drive unit 374. As a result, the modulation unit of the spatial light modulator 330 in a state where the pattern corresponding to the spatial light signal 305 is displayed is irradiated with the collimated beam 302 derived from the laser light 301 emitted from the light source 320.

For example, the light transmission condition setting unit 372 sets, in the light source drive unit 374, a light source control condition for continuously emitting the laser light 301 during a period in which the communication device to be communicated is scanned (also referred to as a scanning period). At this time, the light transmission condition setting unit 372 sets, in the modulator control unit 373, a modulation element control condition for transmitting the spatial light signal 305 of the first projection pattern in order to scan the communication device to be communicated. As a result, the spatial light signal 305 of the first projection pattern for scanning the communication device to be communicated is transmitted from the light transmitting unit 35.

For example, during a period (also referred to as a communication period) in which communication with the communication device to be communicated is performed, the light transmission condition setting unit 372 sets, in the light source drive unit 374, a light source control condition for emitting the spatial light signal 305 according to a signal to be transmitted to the communication device to be communicated. At this time, the light transmission condition setting unit 372 sets, in the modulator control unit 373, a modulation element control condition for transmitting the spatial light signal 305 of the second projection pattern having a projection area smaller than that of the first projection pattern toward the communication device to be communicated. As a result, the spatial light signal 305 of the second projection pattern for communicating with the communication device to be communicated is transmitted from the light transmitting unit 35.

For example, the light transmission condition setting unit 372 sets, in the spatial light modulator 330, a modulation element control condition for selectively transmitting the spatial light signal 305 toward the incoming direction of the spatial light signal 305 for a predetermined period from the timing at which the spatial light signal 305 is received. By limiting the light transmission direction of the spatial light signal 305, it is possible to set the output of the spatial light signal 305 to be transmitted toward the position of the communication device to be communicated high.

The modulator control unit 373 receives the pattern according to the spatial light signal 305 and the modulation element control condition from the light transmission condition setting unit 372. The modulator control unit 373 drives a driver (not illustrated) that changes a pattern set in the modulation unit of the spatial light modulator 330 according to the modulation element control condition received from the light transmission condition setting unit 372. As a result, a pattern corresponding to the spatial light signal 305 is set in the modulation unit of the spatial light modulator 330.

The light source drive unit 374 includes a pulse generator (not illustrated) and a drive circuit (not illustrated). The pulse generator generates a pulse train related to a signal to be transmitted according to the light source control condition received from the light transmission condition setting unit 372, and modulates the drive circuit. When the communication device to be communicated is determined, the pulse generator generates a pulse train related to a signal to be transmitted according to the content of communication with the communication device, and modulates the drive circuit. For example, the content of communication with the communication device is input by an input device (not illustrated). The drive circuit drives the emitter 321 in a state of being modulated in accordance with the pulse train generated by the pulse generator. That is, the light source drive unit 374 drives the emitter 321 in accordance with the pulse train pattern according to the light source control condition received from the light transmission condition setting unit 372, and emits the laser light 301 from the emitter 321. As a result, the modulation unit of the spatial light modulator 330 is irradiated with the collimated beam 302 derived from the laser light 301 in accordance with the timing at which the pattern is set in the modulation unit of the spatial light modulator 330. The collimated beam 302 emitted to the modulation unit of the spatial light modulator 330 is modulated by the modulation unit of the spatial light modulator 330. The modulated light 303 modulated by the modulation unit of the spatial light modulator 330 is transmitted as the spatial light signal 305 related to the pattern displayed on the modulation unit of the spatial light modulator 330.

[Communication Method]

Next, a communication method with a plurality of communication targets by the communication device 3 according to the present example embodiment will be described with reference to the drawings. Here, the communication method by the communication device 3 of the present example embodiment and the communication method by the communication device of the comparative example will be described in comparison. The communication device of the comparative example has only one channel used for communication.

Figure 16:
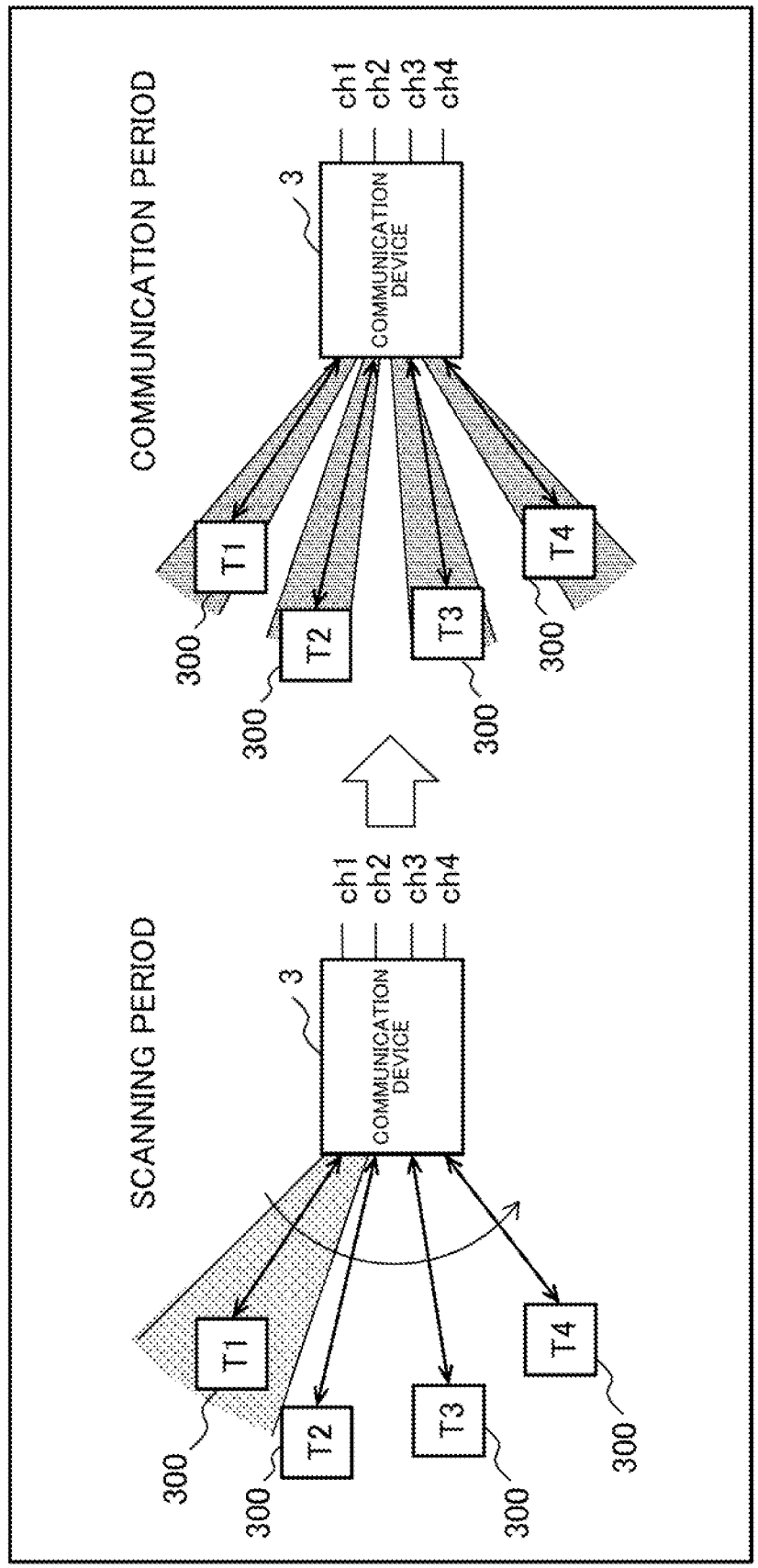
FIG. 16 is a conceptual diagram for describing a communication method of the communication device according to the third example embodiment.

FIG. 16 is a conceptual diagram for describing a communication method by the communication device 3 of the present example embodiment. The left side of the bold arrow in the center shows an example of communication between the communication device 3 and the plurality of communication devices 300 to be communicated in the scanning period. The right side of the bold arrow in the center illustrates an example of communication between the communication device 3 and the plurality of communication devices 300 to be communicated in the communication period.

In the scanning period, the communication device 3 transmits the spatial light signal of the first projection pattern. When receiving the spatial light signals from the communication devices 300 to be communicated (T1 to T4), the communication device 3 identifies the directions of the respective communication devices 300 according to the incoming directions of the spatial light signals. When identifying the respective directions of the communication devices 300, the communication device 3 allocates the channels (ch1 to ch4) to the signals derived from the spatial light signals from the respective communication devices 300 (T1 to T4) and shifts to the communication period.

In the communication period, the communication device 3 transmits a spatial light signal of a second projection pattern having a projection area smaller than that of the first projection pattern to each of the communication devices 300 (T1 to T4). Since the light transmission direction is narrowed in the communication period, the energy of the spatial light signal to be transmitted can be made larger than that in the scanning period. The communication device 3 communicates with each of the plurality of communication devices 300 by processing a signal derived from a spatial light signal from each of the communication devices 300 on a channel allocated to each of the communication devices 300.

Figure 17:
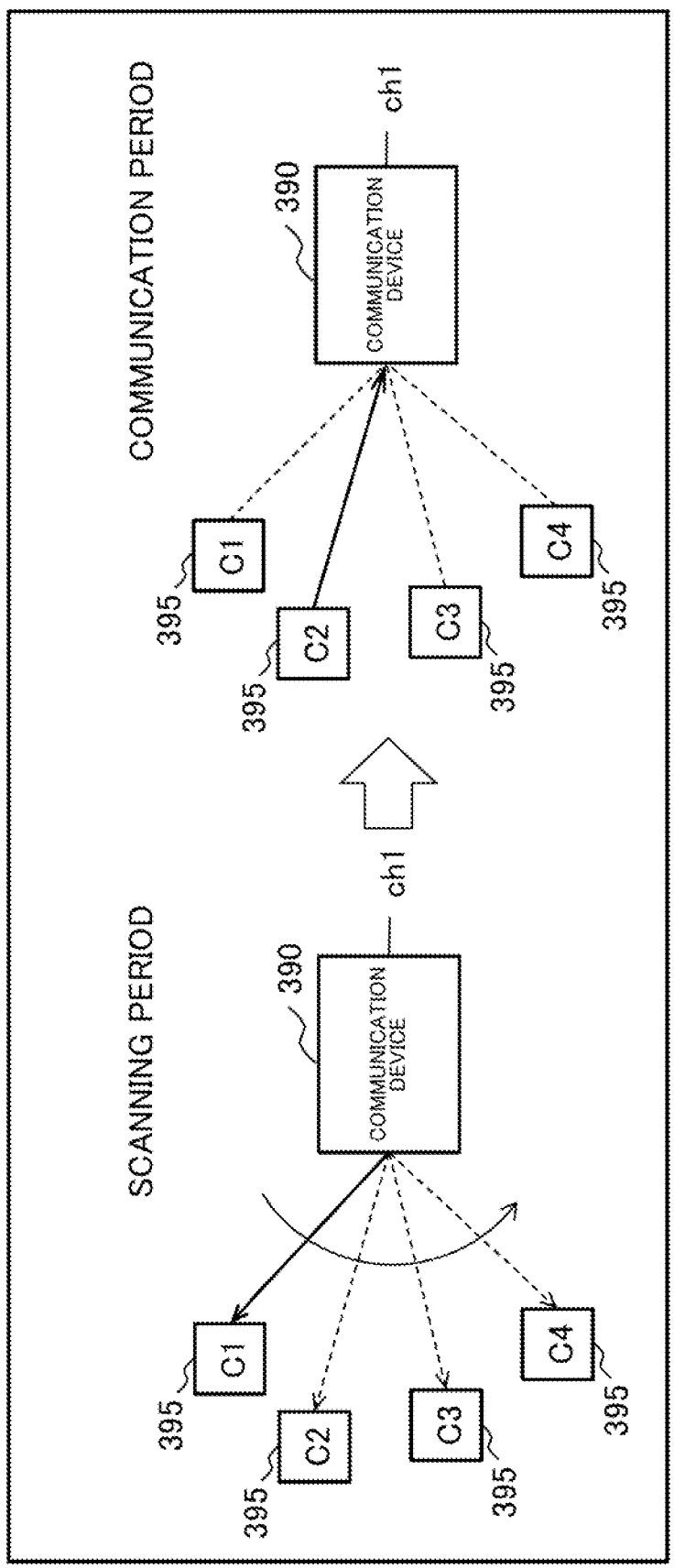
FIG. 17 is a conceptual diagram for explaining a communication method of a comparative example.

FIG. 17 is a conceptual diagram for describing a communication method by a communication device 390 of the comparative example. The left side of the bold arrow in the center shows an example of communication between the communication device 390 and the plurality of communication devices 395 to be communicated in the scanning period. The right side of the bold arrow in the center illustrates an example of communication between the communication device 390 and the plurality of communication devices 395 to be communicated in the communication period.

In the scanning period, the communication device 390 transmits the spatial light signal while changing the light transmission direction. Therefore, the spatial light signal from the communication device 395 sequentially reaches each of the plurality of communication devices 390 (C1 to C4). Similarly, each of the plurality of communication devices 395 transmits the spatial light signal while changing the light transmission direction. The communication device 390 individually receives the spatial light signal from each of the plurality of communication devices 395. The communication device 390 sequentially identifies the position of each communication device 395 based on the spatial light signal from each of the plurality of communication devices 300. At this stage, communication between the communication device 390 and each of the plurality of communication devices 395 (C1 to C4) is established, and the process shifts to the communication period. As described above, in the method of the comparative example, since communication is sequentially established with the individual communication devices 395 (C1 to C4), it takes more time to establish communication, compared with the communication method of the present example embodiment.

In the communication period, the communication device 390 sequentially transmits the spatial light signal to each of the communication devices 395 (C1 to C4). The communication device 390 receives signals derived from the spatial light signals from the individual communication devices 395 (C1 to C4) in a time division manner and processes the signals in a single channel (ch1), thereby communicating with each of the plurality of communication devices 300. Therefore, in the comparative example, in order to obtain a communication speed similar to that of the present example embodiment, it is necessary to configure a system with a very high transmission speed.

As described above, the communication device of the present example embodiment includes the light receiving unit, the light transmitting unit, and the light transmitting control unit. The light receiving unit includes a sensor array, a lens, and a reception unit. The lens collects the spatial light signal. The sensor array includes a plurality of light receivers that receive spatial light signal collected by the lenses. The reception unit integrates the electric signal derived from the spatial light signal received by each of the plurality of light receivers, and selects, according to a voltage value of the integrated electric signal, a light receiver that receives the spatial light signal. The light transmitting unit transmits the second spatial light signal according to the first spatial light signal received by the light receiving unit. The light transmitting control unit controls the light transmitting unit according to the first spatial light signal received by the light receiving unit, and causes the light transmitting unit to transmit the second spatial light signal to the communication target that is the light transmission source of the first spatial light signal.

In an aspect of the present example embodiment, the light transmitting control unit causes the light transmitting unit to transmit the second spatial light signal in the first projection pattern in a scanning period in which at least one communication target is scanned. In a communication period in which communication with at least one communication target is performed, the light transmitting control unit causes the light transmitting unit to transmit the second spatial light signal toward the communication target in a second projection pattern smaller than the first projection pattern.

According to the communication method of the present example embodiment, since the directions from which the plurality of spatial light signals has comes can be instantaneously identified, communication with the communication target can be established at high speed. According to the communication method of the present example embodiment, since communication can be performed simultaneously with a plurality of communication targets, the transmission speed of the communication system can be set low.

Fourth Example Embodiment

Next, a light receiving device according to the fourth example embodiment will be described with reference to the drawings. The light receiving device of the present example embodiment has a configuration obtained by simplifying the light receiving devices of the first and second example embodiments.

Figure 18:
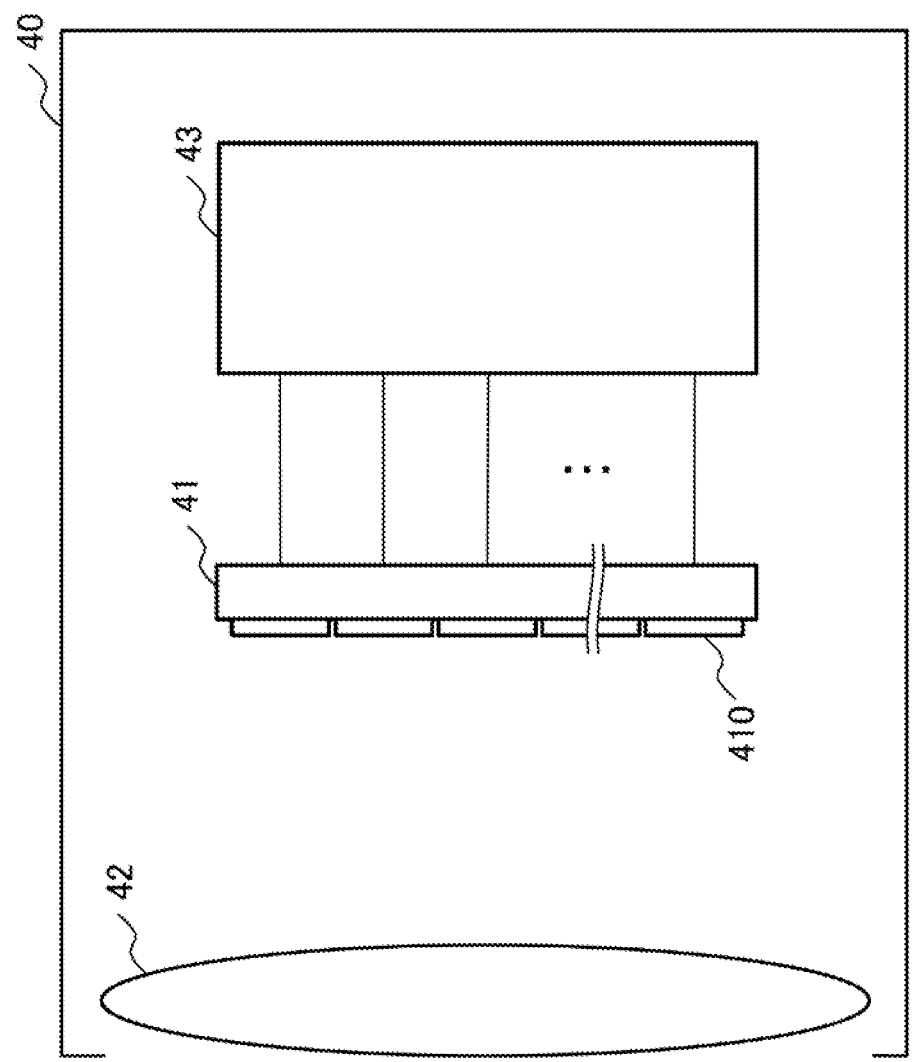
FIG. 18 is a conceptual diagram illustrating an example of a configuration of a light receiving device according to the fourth example embodiment.

FIG. 18 is a conceptual diagram illustrating an example of a light receiving device 40 of the present example embodiment. The light receiving device 40 includes a sensor array 41, a lens 42, and a reception unit 43.

The lens 42 collects the spatial light signal. The sensor array 41 includes a plurality of light receivers 410 that receive the spatial light signal collected by the lens 42. The reception unit 43 integrates the electric signal derived from the spatial light signal received by each of the plurality of light receivers 410, and receives the spatial light signal according to the voltage value of the integrated electric signal.

The light receiving device of the present example embodiment receives the spatial light signal condensed by the lens by at least any one of the plurality of light receivers. The light receiving device according to the present example embodiment integrates the electric signal derived from the spatial light signal received by each of the plurality of light receivers to set the voltage of the electric signal to a measurable level. Then, the light receiving device of the present example embodiment receives the spatial light signal according to the integrated voltage value of the electric signal.

According to the light receiving device of the present example embodiment, spatial light signals coming from various directions can be efficiently received.

(Hardware)

Here, a hardware configuration for executing processing of the control system (reception unit 13, control circuit 16, light transmitting control unit 37, and the like) according to each example embodiment will be described using an information processing device 90 of FIG. 19 as an example. The information processing device 90 in FIG. 19 is a configuration example for executing processing of the control system of each example embodiment, and does not limit the scope of the present invention.

As illustrated in FIG. 19, the information processing device 90 includes a processor 91, a main storage device 92, an auxiliary storage device 93, an input/output interface 95, and a communication interface 96. In FIG. 19, the interface is abbreviated as an interface (I/F). The processor 91, the main storage device 92, the auxiliary storage device 93, the input/output interface 95, and the communication interface 96 are data-communicably connected to each other via a bus 98. The processor 91, the main storage device 92, the auxiliary storage device 93, and the input/output interface 95 are connected to a network such as the Internet or an intranet via the communication interface 96.

The processor 91 develops the program stored in the auxiliary storage device 93 or the like in the main storage device 92 and executes the developed program. In the present example embodiment, a software program installed in the information processing device 90 may be used. The processor 91 executes processing by the control system according to the present example embodiment.

The main storage device 92 has an area in which a program is developed. The main storage device 92 may be a volatile memory such as a dynamic random access memory (DRAM). A nonvolatile memory such as a magnetoresistive random access memory (MRAM) may be configured and added as the main storage device 92.

The auxiliary storage device 93 stores various pieces of data. The auxiliary storage device 93 includes a local disk such as a hard disk or a flash memory. Various pieces of data may be stored in the main storage device 92, and the auxiliary storage device 93 may be omitted.

The input/output interface 95 is an interface that connects the information processing device 90 with a peripheral device. The communication interface 96 is an interface that connects to an external system or a device through a network such as the Internet or an intranet in accordance with a standard or a specification. The input/output interface 95 and the communication interface 96 may be shared as an interface connected to an external device.

An input device such as a keyboard, a mouse, or a touch panel may be connected to the information processing device 90 as necessary. These input devices are used to input information and settings. When the touch panel is used as the input device, the display screen of the display device may also serve as the interface of the input device. Data communication between the processor 91 and the input device may be mediated by the input/output interface 95.

The information processing device 90 may be provided with a display device that displays information. In a case where a display device is provided, the information processing device 90 preferably includes a display control device (not illustrated) that controls display of the display device. The display device may be connected to the information processing device 90 via the input/output interface 95.

The above is an example of a hardware configuration for enabling processing by the control system according to each example embodiment. The hardware configuration of FIG. 19 is an example of a hardware configuration for executing the arithmetic processing of the control system according to each example embodiment, and does not limit the scope of the present invention. A program for causing a computer to execute processing of the control system according to each example embodiment is also included in the scope of the present invention. A recording medium in which the program according to each example embodiment is recorded is also included in the scope of the present invention. The recording medium can be achieved by, for example, an optical recording medium such as a compact disc (CD) or a digital versatile disc (DVD). The recording medium may be achieved by a semiconductor recording medium such as a Universal Serial Bus (USB) memory or a secure digital (SD) card, a magnetic recording medium such as a flexible disk, or another recording medium.

The components of the control system of each example embodiment can be combined in any manner. The components of the control system of each example embodiment may be achieved by software or may be achieved by a circuit.

While the present invention is described with reference to example embodiments thereof, the present invention is not limited to these example embodiments. Various modifications that can be understood by those of ordinary skill in the art can be made to the configuration and details of the present invention within the scope of the present invention.

This application is based upon and claims the benefit of priority from Japanese patent application No. 2020-113680, filed on Jul. 1, 2020, the disclosure of which is incorporated herein in its entirety by reference.

REFERENCE SIGNS LIST 3 communication device
10, 20, 40 light receiving device
11, 21 sensor array
12, 22 lens 13, 23 reception unit
15 first processing circuit
16 control circuit
17 selector
18 second processing circuit
35 light transmitting unit
37 light transmitting control unit
110, 210 light receiver
151 high-pass filter
153 amplifier
155 integrator
211 light pipe
320 light source
321 emitter
323 collimator
330 spatial light modulator
340 projection optical system
346 Fourier transform lens
347 aperture
348 projection lens
371 light transmission condition storage unit
372 light transmission condition setting unit
373 modulator control unit
374 light source drive unit

What is claimed is:

1. A light receiving device comprising:
a lens that collects a spatial light signal;
a sensor array including a plurality of light receivers that receives the spatial light signal collected by the lens, light receiving faces of the plurality of light receivers are disposed in an array on a same plane in a same direction, the light receiving faces of the plurality of light receivers are located between a main surface and a focal surface of the lens;
a plurality of first processing circuits that are associated with the plurality of respective light receivers, amplifies the electric signals derived from the spatial light signal received by the plurality of respective light receivers, and integrates each of the electric signals;
a selector that receives the electric signals amplified by the first processing circuits and that selectively outputs at least any one of the received electric signals;
a second processing circuit that decodes the electric signal output from the selector;
a memory that is configured to store instructions; and
a processor that is configured to execute the instructions to:
cause an integrator to integrate an electric signal derived from the spatial light signal received by each of the plurality of light receivers;
cause the selector to select a light receiver, from among the plurality of light receivers, that receives the spatial light signal according to a voltage value of the electric signal integrated by each of the plurality of first processing circuits;
cause the selector to allocate the electric signal from the selected light receiver to any one of a plurality of the second processing circuits;
in a case where the spatial light signal from each of a plurality of light transmission sources is received by a plurality of the light receivers adjacent to each other, execute the instructions to cause the selector to select a light receiver that receives the spatial light signal for each of the light transmission sources according to a voltage value of the electric signal integrated by each of the plurality of first processing circuits; and
in a case where the processor is not allowed to select a light receiver that receives the spatial light signal for each of the light transmission sources according to a voltage value of the electric signal integrated by each of the plurality of first processing circuits, execute the instructions to cause the same light receiver to receive the spatial light signal in a time division manner for each of the light transmission sources.

2. The light receiving device according to claim 1, wherein the processor is configured to:
in a case where the spatial light signal is received by a plurality of the light receivers adjacent to each other, execute the instructions to cause the selector to select a light receiver having a maximum voltage value among voltage values of the electric signals integrated by the plurality of first processing circuits as the light receiver that receives the spatial light signal.

3. The light receiving device according to claim 1, wherein
the sensor array includes:
a plurality of light pipes, each of the plurality of light pipe is associated with the respective light receiving face each of the plurality of light receivers and guides the spatial light signal to each of the light receiving face each of the plurality of light receivers.

4. The light receiving device according to claim 3, wherein
each of the plurality of light pipes has an incident face on which the spatial light signal is incident and an outgoing face from which a light signal incident from the incident face and guided is emitted, and the light pipes are disposed in such a way that the incident faces form a same plane without a gap, and wherein
each of the plurality of light pipes is disposed in such a way that the outgoing face faces the associated light receiving face.

5. A communication device comprising:
a light reception apparatus including a lens that collects a first spatial light signal transmitted from at least one communication target and a sensor array including a plurality of light receivers that receive the first spatial light signal collected by the lens, light receiving faces of the plurality of light receivers are disposed in an array on a same plane in a same direction, the light receiving faces of the plurality of light receivers are located between a main surface and a focal surface of the lens, a plurality of first processing circuits that are associated with the plurality of respective light receivers, amplifies the electric signals derived from the first spatial light signal received by the plurality of respective light receivers, and integrates each of the electric signals, a selector that receives the electric signals amplified by the first processing circuits and that selectively outputs at least any one of the received electric signals, and a second processing circuit that decodes the electric signal output from the selector;
a light transmitter that transmits a second spatial light signal according to the first spatial light signal received by the light reception apparatus; and
a memory that is configured to store instructions, and
a processor that is configured to execute the instructions to
cause an integrator to integrate an electric signal derived from the first spatial light signal received by each of the plurality of light receivers,
cause the selector to select a light receiver that receives the first spatial light signal according to a voltage value of the electric signal integrated by each of the plurality of first processing circuits,
cause the selector to allocate the electric signal from the selected light receiver to any one of a plurality of the second processing circuits,
in a case where the first spatial light signal from each of a plurality of light transmission sources is received by a plurality of the light receivers adjacent to each other, execute the instructions to cause the selector to select a light receiver that receives the first spatial light signal for each of the light transmission sources according to a voltage value of the electric signal integrated by each of the plurality of first processing circuits,
in a case where the processor is not allowed to select a light receiver that receives the first spatial light signal for each of the light transmission sources according to a voltage value of the electric signal integrated by each of the plurality of first processing circuits, execute the instructions to cause the same light receiver to receive the first spatial light signal in a time division manner for each of the light transmission sources,
control the light transmitter according to the first spatial light signal received by the light reception apparatus, and
cause the light transmitter to transmit the second spatial light signal to the at least one communication target that is a light transmission source of the first spatial light signal.

6. The communication device according to claim 5, wherein the processor is configured to execute the instructions to:
cause the light transmitter to transmit, in a scanning period in which at least one communication target is scanned, the second spatial light signal in a first projection pattern, and
cause the light transmitter to transmit, in a communication period in which communication with at least one communication target is performed, the second spatial light signal in a second projection pattern smaller than the first projection pattern toward the at least one communication target.

* * * * *